US008481376B2

(12) United States Patent
Saxler et al.

(10) Patent No.: US 8,481,376 B2
(45) Date of Patent: Jul. 9, 2013

(54) GROUP III NITRIDE SEMICONDUCTOR DEVICES WITH SILICON NITRIDE LAYERS AND METHODS OF MANUFACTURING SUCH DEVICES

(75) Inventors: Adam William Saxler, Durham, NC (US); Scott T. Sheppard, Chapel Hill, NC (US)

(73) Assignee: Cree, Inc., Durham, NC (US)

( * ) Notice: Subject to any disclaimer, the term of this patent is extended or adjusted under 35 U.S.C. 154(b) by 14 days.

(21) Appl. No.: 13/010,053

(22) Filed: Jan. 20, 2011

(65) Prior Publication Data

US 2011/0136305 A1 Jun. 9, 2011

Related U.S. Application Data

(63) Continuation of application No. 11/286,805, filed on Nov. 23, 2005, now Pat. No. 7,901,994, which is a continuation-in-part of application No. 10/758,871, filed on Jan. 16, 2004, now Pat. No. 7,045,404.

(51) Int. Cl.
*H01L 21/338* (2006.01)

(52) U.S. Cl.
USPC .................. 438/172; 438/604; 257/E21.451; 257/E21.158

(58) Field of Classification Search
USPC .......... 438/172, 604; 257/192, 194, E21.451, 257/E21.158
See application file for complete search history.

(56) References Cited

U.S. PATENT DOCUMENTS

| 4,424,525 A | 1/1984 | Mimura |
| 4,471,366 A | 9/1984 | Delagebeaudeuf et al. |
| 4,727,403 A | 2/1988 | Hilda et al. |
| 4,755,867 A | 7/1988 | Cheng |
| 4,788,156 A | 11/1988 | Stoneham et al. |
| 4,946,547 A | 8/1990 | Palmour et al. |

(Continued)

FOREIGN PATENT DOCUMENTS

| EP | 0 334 006 A1 | 9/1989 |
| EP | 0 563 847 A2 | 10/1993 |

(Continued)

OTHER PUBLICATIONS

Notice of Final Rejection from Korean Intellectual Property Office Corresponding to Korean Patent Application No. 10-2006-7014147; Dated Nov. 21, 2011; Korean Text, 3 pages, English Translation thereof, 2 pages.

(Continued)

*Primary Examiner* — Leonard Chang
(74) *Attorney, Agent, or Firm* — Myers Bigel Sibley & Sajovec

(57) ABSTRACT

Methods of fabricating transistor in which a first Group III nitride layer is formed on a substrate in a reactor, and a second Group III nitride layer is formed on the first Group III nitride layer. An insulating layer such as, for example, a silicon nitride layer is formed on the second Group III nitride layer in-situ in the reactor. The substrate including the first Group III nitride layer, the second group III nitride layer and the silicon nitride layer is removed from the reactor, and the silicon nitride layer is patterned to form a first contact hole that exposes a first contact region of the second Group III nitride layer. A metal contact is formed on the first contact region of the second Group III nitride layer.

20 Claims, 10 Drawing Sheets

U.S. PATENT DOCUMENTS

| | | | |
|---|---|---|---|
| 4,987,008 A | 1/1991 | Yamazaki et al. | |
| 5,053,348 A | 10/1991 | Mishra et al. | |
| 5,172,197 A | 12/1992 | Nguyen et al. | |
| 5,192,987 A | 3/1993 | Khan et al. | |
| 5,196,358 A | 3/1993 | Boos | |
| 5,200,022 A | 4/1993 | Kong et al. | |
| 5,210,051 A | 5/1993 | Carter, Jr. | |
| 5,292,501 A | 3/1994 | Degenhardt et al. | |
| 5,296,395 A | 3/1994 | Khan et al. | |
| 5,298,445 A | 3/1994 | Asano | |
| 5,302,840 A | 4/1994 | Takikawa | |
| RE34,861 E | 2/1995 | Davis et al. | |
| 5,389,571 A | 2/1995 | Takeuchi et al. | |
| 5,393,993 A | 2/1995 | Edmond et al. | |
| 5,523,589 A | 6/1996 | Edmond et al. | |
| 5,534,462 A | 7/1996 | Fiordalice et al. | |
| 5,569,943 A | 10/1996 | Koscica et al. | |
| 5,592,501 A | 1/1997 | Edmond et al. | |
| 5,686,737 A | 11/1997 | Allen | |
| 5,700,714 A | 12/1997 | Ogihara et al. | |
| 5,701,019 A | 12/1997 | Matsumoto et al. | |
| 5,705,827 A | 1/1998 | Baba et al. | |
| 5,796,127 A * | 8/1998 | Hayafuji et al. | 257/194 |
| 5,804,482 A | 9/1998 | Konstantinov et al. | |
| 5,885,860 A | 3/1999 | Weitzel et al. | |
| 5,900,641 A | 5/1999 | Hara et al. | |
| 5,946,547 A | 8/1999 | Kim et al. | |
| 5,990,531 A | 11/1999 | Taskar et al. | |
| 6,025,613 A | 2/2000 | Bito et al. | |
| 6,028,328 A | 2/2000 | Riechert et al. | |
| 6,046,464 A | 4/2000 | Schetzina | |
| 6,064,082 A | 5/2000 | Kawai et al. | |
| 6,065,973 A * | 5/2000 | Lien et al. | 438/128 |
| 6,086,673 A | 7/2000 | Molnar | |
| 6,150,680 A | 11/2000 | Eastman et al. | |
| 6,156,644 A | 12/2000 | Ko et al. | |
| 6,177,685 B1 | 1/2001 | Teraguchi et al. | |
| 6,218,680 B1 | 4/2001 | Carter, Jr. et al. | |
| 6,242,327 B1 | 6/2001 | Yokoyama et al. | |
| 6,316,793 B1 | 11/2001 | Sheppard et al. | |
| 6,429,467 B1 | 8/2002 | Ando | |
| 6,429,468 B1 | 8/2002 | Hsu et al. | |
| 6,447,604 B1 | 9/2002 | Flynn et al. | |
| 6,448,648 B1 | 9/2002 | Boos | |
| 6,492,669 B2 | 12/2002 | Nakayama et al. | |
| 6,498,111 B1 | 12/2002 | Kapolnek et al. | |
| 6,515,316 B1 | 2/2003 | Wojtowicz et al. | |
| 6,548,333 B2 | 4/2003 | Smith | |
| 6,586,781 B2 | 7/2003 | Wu et al. | |
| 6,639,255 B2 | 10/2003 | Inoue et al. | |
| 6,852,615 B2 | 2/2005 | Micovic et al. | |
| 7,030,428 B2 | 4/2006 | Saxler | |
| 7,052,942 B1 | 5/2006 | Smart et al. | |
| 7,230,284 B2 * | 6/2007 | Parikh et al. | 257/194 |
| 2001/0015446 A1 | 8/2001 | Inoue et al. | |
| 2001/0017370 A1 | 8/2001 | Sheppard et al. | |
| 2001/0020700 A1 | 9/2001 | Inoue et al. | |
| 2001/0023964 A1 | 9/2001 | Wu et al. | |
| 2001/0040246 A1 | 11/2001 | Ishii | |
| 2002/0008241 A1 | 1/2002 | Edmond et al. | |
| 2002/0017696 A1 | 2/2002 | Nakayama et al. | |
| 2002/0066908 A1 | 6/2002 | Smith | |
| 2002/0079508 A1 | 6/2002 | Yoshida | |
| 2002/0119610 A1 | 8/2002 | Nishii et al. | |
| 2002/0163012 A1 | 11/2002 | Nihei et al. | |
| 2002/0167023 A1 | 11/2002 | Chavarkar et al. | |
| 2003/0017683 A1 | 1/2003 | Emrick et al. | |
| 2003/0020092 A1 | 1/2003 | Parikh et al. | |
| 2003/0032297 A1 * | 2/2003 | Lindstrom et al. | 438/706 |
| 2003/0102482 A1 | 6/2003 | Saxler | |
| 2003/0123829 A1 | 7/2003 | Taylor | |
| 2003/0145784 A1 | 8/2003 | Thompson et al. | |
| 2003/0157776 A1 | 8/2003 | Smith | |
| 2003/0213975 A1 | 11/2003 | Hirose et al. | |
| 2004/0004223 A1 | 1/2004 | Nagahama et al. | |
| 2004/0021152 A1 | 2/2004 | Nguyen et al. | |
| 2004/0029330 A1 | 2/2004 | Hussain et al. | |
| 2004/0061129 A1 | 4/2004 | Saxler et al. | |
| 2004/0124435 A1 | 7/2004 | D'Evelyn et al. | |
| 2004/0144991 A1 | 7/2004 | Kikkawa | |
| 2004/0241970 A1 | 12/2004 | Ring | |
| 2005/0133816 A1 | 6/2005 | Fan et al. | |
| 2006/0006414 A1 * | 1/2006 | Germain et al. | 257/192 |
| 2006/0043415 A1 | 3/2006 | Okamoto et al. | |
| 2006/0054925 A1 | 3/2006 | Kikkawa | |

FOREIGN PATENT DOCUMENTS

| | | |
|---|---|---|
| JP | 10-050982 | 2/1998 |
| JP | 11261053 | 9/1999 |
| JP | 2001230407 A | 8/2001 |
| JP | 2002016087 A | 1/2002 |
| JP | 2003-86608 A | 3/2003 |
| JP | 2004-342810 | 12/2004 |
| WO | WO 93/23877 A1 | 11/1993 |
| WO | WO 01/57929 A1 | 8/2001 |
| WO | WO 03/049193 A1 | 6/2003 |
| WO | WO 2004/008495 | 1/2004 |

OTHER PUBLICATIONS

Notice of Preliminary Rejection (Non-Final) corresponding to Korean Patent Application No. 10-2006-7014147 dated Feb. 18, 2011; 6 pages.

Official Action Corresponding to Japanese Patent Application No. 2006-549235; Mailing Date: May 20, 2011; 7 Pages.

Ambacher et al., "Two Dimensional Electron Gases Induced by Spontaneous and Piezoelectric Polarization Charges in N- and Ga-face AlGaN/GaN Heterostructures," *Journal of Applied Physics*. vol. 85, No. 6, pp. 3222-3233 (Mar. 1999).

Ando et al., "10-W/mm AlGaN-GaN HFET With a Field Modulating Plate," *IEEE Electron Device Letters*, 24(5), pp. 289-291 (May 2003).

Asbeck et al. "Piezoelectric charge densities in AlGaN/GaN HFETs," *Elecronics Letters*. vol. 33, No. 14, pp. 1230-1231 (1997).

Beaumont, B. et al., "Epitaxial Lateral Overgrowth of GaN," *Phys. Stat. Sol.* (b) 227, No. 1, pp. 1-43 (2001).

Ben-Yaacov et al., "AlGaN/GaN Current Aperture Vertical Electron Transistors with Regrown Channels," *Journal of Applied Physics*. vol. 95, No. 4, pp. 2073-2078 (2004).

Breitschadel et al. "Minimization of Leakage Current of Recessed Gate AlGaN/GaN HEMTs by Optimizing the Dry-Etching Process," *Journal of Electronic Materials*. vol. 28, No. 12, pp. 1420-1423 (1999).

Burm et al. "Recessed Gate GaN MODFETS," *Solid-State Electronics*. vol. 41, No. 2, pp. 247-250 (1997).

Burm et al. "Ultra-Low Resistive Ohmic Contacts on n-GaN Using Si Implantation," *Applied Physics Letters*. vol. 70, No. 4, 464-66 (1997).

Chang et al., "AlGaN/GaN Modulation-Doped Field-Effect Transistors with an Mg-doped Carrier Confinement Layer," *Jpn. J. Appl. Phys.*, 42:3316-3319 (2003).

Chen et al. "C12 reactive ion etching for gate recessing of AlGaN/GaN field-effect transistors," *J. Vac. Sci. Technol. B*. vol. 17, No. 6, pp. 2755-2758 (1999).

Chini et al., "Power and Linearity Characteristics of Field-Plagted Recessed-Gate AlGaN-GaN HEMTs," *IEEE Electron Device Letters*, 25(5), pp. 229-231 (May 2004).

Cho et al., "A New GaAs Field Effect Transistor (FET) with Dipole Barrier (DIB)," *Jpn. J. Appl. Phys*. 33:775-778 (1994).

Coffie et al., Unpassivated p-GaN/AlGaN/GaN HEMTs with 7.1 W/MMF at 10 GHz, *Electronic Letters online No. 20030872*, 39(19), (Sep. 18, 2003).

Derluyn et al., "Improvement of AlGAN/Gan High Electron mobility Transistor Structures in In Situ Deposition of $Si_3N_4$ Surface Layer," *J. Appl. Phys*, vol. 98, 054501, Sep. 2, 2005.

Derluyn et al., Improvement of AlGAN/Gan High Electron mobility Transistor Structures in situ Deposition.

Eastman et al. "GaN materials for high power microwave amplifiers," *Mat. Res. Soc. Symp. Proc*. vol. 512 (1998).

Eastman et al. "Undoped AlGaN/GaN HEMTs for Microwave Power Amplification," *IEEE Transactions on Electron Devices*. vol. 48, No. 3 pp. 479-485 (Mar. 2001).

Egawa et al. "Recessed gate ALGaN/GaN MODFET on Sapphire Grown by MOCVD," *Applied Physics Letters.* vol. 76, No. 1, pp. 121-123 (Jan. 2000).

Gaska et al. "High-Temperature Performance of AlGaN/GaN HFET's on SiC Substrates," *IEEE Electron Device Letters.* vol. 18, No. 1, pp. 492-494 (Oct. 1997).

Gaska et al. "Electron Transport in AlGaN/GaN Heterostructures Grown on 6H-SiC Substrates," *Applied Physics Letters.* vol. 72, No. 6, pp. 707-709 (Feb. 1998).

Gaska et al., "Self-Heating in High-Power AlGaN/GaN HFET's," *IEEE Electron Device Letters*, 19(3), pp. 89-91 (Mar. 1998).

Gelmont et al. "Monte Carlo simulation of electron transport in gallium nitride," *Journal of Applied Physics.* vol. 74, No. 3, pp. 1818-1821 (Aug. 1993).

Gotz, et al. "Hydrogen Passivation of Mg Acceptors in GaN Grown by Metalorganic Chemical Vapor Deposition," Appl. Phys. Lett 67 (18), Oct. 30, 1985.

Heikman et al. "Polarization Effects in AlGaN/GaN and GaN/AlGaN/GaN heterostructures," *Journal of Applied Physics.* vol. 93, No. 12, pp. 10114-10118 (Jun. 2003).

Heikman et al., "Growth of Fe-Doped Semi-insulating GaN by Metalorganic Chemical Vapor Deposition," *Applied Physics Letters.* vol. 83, No. 1, pp. 439-441 (Jul. 2002).

Heikman, et al., "Mass Transport Regrowth of GaN for Ohmic Contacts to AlGaN/GaN," *Applied Physics Letters.* vol. 78, No. 19, pp. 2876.

Heikman, Sten J., *MOCVD Growth Technologies for Applications in AlGaN/GaN High Electron Mobility Transistors*, Dissertation, University of California—Santa Barbara, Sep. 2002, 190 pages.

Hikita et al., "350V/150A AlGaN/GaN Power HFET on Silicon Substrate With Source-via Grouding (SVG) Structure," *Electron Devices Meeting*, 2004, pp. 803-806, IEDM Technical Digest. IEEE International (Dec. 2004).

Kanaev et al. "Femtosecond and Ultraviolet Laser Irradiation of Graphitelike Hexagonal Boron Nitride," *Journal of Applied Physics*, 96(8), pp. 4483-4489 (Oct. 15, 2004).

Kanamura et al., "A 100-W High-Gain AlGaN/GaN HEMT Power Amplifier on a Conductive N-SiC Substrate for Wireless Base Station Applications," *Electron Devices Meeting*, 2004, pp. 799-802, IEDM Technical Digest. IEEE International (Dec. 2004).

Karmalkar et al. "Enhancement of Breakdown Voltage in AlGaN/GaN High Electron Mobility Transistors Using a Field Plate," *IEEE Transactions on Electron Devices.* vol. 48, No. 8, pp. 1515-1521 (Aug. 2001).

Karmalkar et al. "RESURF AlGaN/GaN HEMT for High Voltage Power Switching," *IEEE Electron Device Letters.* vol. 22, No. 8, pp. 373-375 (Aug. 2001).

Karmalkar et al., "Very High Voltage AlGaN/GaN High Electron Mobility Transistors Using a Field Plate Deposited on a Stepped Insulator," *Solid State Electronics*, vol. 45, pp. 1645-1652 (2001).

Kashahara et al. "Ka-ban 2.3W Power AlGaN/GaN Heterojunction FET," *IEDM Technical Digest*, pp. 677-680 (2002).

Komiak et al., "Fully Monolithic 4 Watt High Efficiency Ka-band Power Amplifier," *IEEE MTT-S International Microwave Symposium Digest*, vol. 3, pp. 947-950 (1999).

Ktecki et al., "Hydrogen Incorporation in Silicon Nitride Films Deposited by Remote Electron-Cyclotron-Resonance Chemical Vapor Deposition," *J. Appl. Phys.*, vol. 77 (3), Feb. 1, 1995.

Küsters et al., "Double-Heterojunction Lattice-Matched and Pseudomorphic InGaAs HEMT with •-Doped InP Supply Layers and p-InP Barier Enhancement Layer Grown by LP-MOVPE," *IEEE Electron Device Letters*, 14(1), (Jan. 1993).

Kuzmik et al. "Annealing of Schottky contacts deposited on dry etched AlGaN/Gan," *Semiconductor Science and Technology.* vol. 17, No. 11 (Nov. 2002).

Leys, et al. "Surface Stabilization for Higher Performance AlGaN/GaN HEMT with in-situ MOVPE SIN," *Mater Res. Soc. Symp. Proc.* vol. 831,2005.

Masaki et al., "Structural and Electrical Properties of $SiN_xH$ Films," *J. Appl. Phys.* vol. 73 (10), May 15, 1993, pp. 5088-5094.

Martil et al., Rapid Thermally Annealed Plasma Deposited $SiN_xH$ Films; Application to Metal-Insulator-Semiconductor Structures with Si, $In_{0.53}Ga_{0.47}As$, and InP, *J. Appl. Phys.*, vol. 94 (4), Aug. 15, 2003, pp. 2642-2653.

Manfra et al., "Electron Mobility Exceeding 160 000 $cm^2/V$ s in AlGaN/GaN Heterostructures Grown by Molecular-beam Epitaxy," *Applied Physics Letters*, 85(22), pp. 5394-5396 (Nov. 29, 2004).

Manfra et al., "High Mobility AlGaN/GaN Heterostructures Grown by Plasma-assisted Molecular beam epitaxy on Semi-Insulating GaN Templates Prepared by Hydride Vapor Phase Epitaxy," *Journal of Applied Physics*, 92(1), pp. 338-345 (Jul. 1, 2002).

Manfra et al., "High-Mobility AlGaN/GaN Heterostructures Grown by Molecular-beam Epitaxy on GaN Templates Prepared by Hydride Vapor Phase Epitaxy," *Applied Physics Letters*, 77(18), pp. 2888-2890 (Oct. 30, 2000).

Neugebauer, et al., "Role of Hydrogen in Doping of GaN," Appl. Phys. Lett. 68 (13) Mar. 25, 1996.

Neuburger et al. "Design of GaN-based Field Effect Transistor Structures based on Doping Screening of Polarization Fields," WA 1.5, 7th Wide-Gandgap III-Nitride Workshop (Mar. 2002).

Park, et al., "Deposited Silicon Nitride With Low Electron Trapping Rates," *J. Appl. Phys.* vol. 74 (1), Jul. 1, 1993, pp. 381-386.

Parikh et al., "Development of Gallium Nitride Epitaxy and Associated Material-Device Correlation for RF, Microwave and MM-wave Applications," Cree, Inc. (35 slides).

Ping et al. "DC and Microwave Performance of High-Current AlGaN/GaN Heterostructure Field Effect Transistors Grown on p-Type SiC Substrates," *IEEE Electron Device Letters.* vol. 19, No. 2, pp. 54-56 (Feb. 1998).

Saxler et al., "III-Nitride Heterostructures on High-Purity Semi-Insulating 4H-SiC Substrates for High-Power RF Transistors," International Workshop on Nitride Semiconductors (Jul. 19, 2004).

Shen et al., "High-Power Polarization-Engineered GaN/AlGaN/GaN HEMTs Without Surface Passivation," *IEEE Electronics Device Letters.* vol. 25, No. 1, pp. 7-9 (2004).

Sheppard et al. "High Power Demonstration at 10 GHz with GaN/AlGaN HEMT Hybrid Amplifiers." Presented at the 58th DRC, Denver, CO, Jun. 2000.

Sheppard et al. "Improved 10-GHz Operation of GaN/AlGaN HEMTs on Silicon Carbide," *Materials Science Forum.* vols. 338-342, pp. 1643-1646, (2000).

Shiojima et al., "Improved Carrier Confinement by a Buried p-Layer in the AlGaN/GaN HEMT Structure," *IEICE Trans. Electron.*, E83-C(12), (Dec. 2000).

Sriram et al. "RF Performance of AlGaN/GaN MODFET's on High Resistivity SiC Substrates," Presentation at Materials Research Society Fall Symposium, 1997.

Sriram et al. "SiC and GaN Wide Bandgap Microwave Power Transistors," *IEEE Sarnoff Symposium*, Pittsburgh, PA, Mar. 18, 1998.

Sullivan et al. "High-Power 10-GHz Operation of AlGaN HFET's on Insulating SiC," *IEEE Electron Device Letters.* vol. 19, No. 6, pp. 198-200 (Jun. 1998).

"Thick AlN template on SiC substrate—Novel semi insulating substrate for GaN-based devices," © 2003 by TDI, Inc., http://www.tdii.com/products/AlN_SiCT.html.

Tilak et al., "Influence of Barrier Thickness on the High-Power Performance of AlGaN/GaN HEMTs," *IEEE Electron Device Letters*, 22(11), pp. 504-506 (Nov. 2001).

United States Patent Application entitled Passivation of Wide Band-Gap Based Semiconductor Devices with Hydrogen-Free Sputtered Nitrides, U.S. Appl. No. 11/169,378, filed Jun. 29, 2005 with USPTO.

United States Patent Application entitled "Nitride-Based Transistors and Methods of Fabrication Thereof Using Non-Etched Contact Recesses," U.S. Appl. No. 10/617,843, filed Jul. 11, 2003.

United States Patent Application entitled "Improved Dielectric Passivation for Semiconductor Devices," U.S. Appl. No. 10/851,507, filed May 22, 2004.

United States Patent Application entitled "Methods of Having Laterally Grown Active Region and Methods of Fabricating Same," filed Jul. 26, 2004.

United States Patent Application entitled "Silicon Carbide on Diamond Substrates and Related Devices and Methods," U.S. Appl. No. 10/707,898, filed Jan. 22, 2004.

United States Patent Application entitled "Methods of Fabricating Nitride-Based Transistors with a Cap Layer and a Recessed Gate," U.S. Appl. No. 10/897,726, filed Jul. 23, 2004.

United States Patent Application entitled "Semiconductor Devices Having a Hybrid Channel Layer, Current Aperture Transistors and Methods of Fabricating the Same," U.S. Appl. No.10/849,589, filed May 20, 2004.

United States Patent Application entitled "Methods of Fabricating Nitride-Based Transistors Having Regrown Ohmic Contact Regions and Nitride-Based Transistors Having Regrown Ohmic Contact Regions," U.S. Appl. No. 10/849,617, filed May 20, 2004.

United States Patent Application entitled "High Power Density and/or Linearity Transistors," U.S. Appl. No. 11/005,107, filed Dec. 6, 2004.

United States Patent Application entitled "Field Effect Transistors (FETS) Having Multi-Watt Output Power at Millimeter-Wave Frequencies," U.S. Appl. No. 11/005,423, filed Dec. 6, 2004.

United States Patent Application entitled "Group III Nitride Field Effect Transistors (FETs) Capable of Withstanding High Temperature Reverse Bias Test Conditions," U.S. Appl. No. 11/080,905, filed Mar. 15, 2005.

United States Patent Application entitled "Aluminum Free Group III-Nitride Based High Electron Mobility Transistors and Methods of Fabricating Same," U.S. Appl. No. 11/118,575, filed Apr. 29, 2005.

United States Patent Application entitled "Binary Group III-Nitride Based High Electron Mobility Transistors and Methods of Fabricating Same," U.S. Appl. No. 11/118,675, filed Apr. 29, 2005.

United States Patent Application entitled "Composite Substrates of Conductive and Insulating or Semi-Insulating Group III-Nitrides for Group III-Nitride Devices," U.S. Appl. No. 11/103,127, filed Apr. 11, 2005.

United States Patent Application entitled "Thick Semi-Insulating or Insulating Epitaxial Gallium Nitride Layers and Devices Incorporating Same," U.S. Appl. No. 11/103,117, filed Apr. 11, 2005.

United States Patent Application entitled "Cap Layers and/or Passivation Layers for Nitride-Based Transistors, Transistor Structures and Methods of Fabricating Same," U.S. Appl. No. 10/996,249, filed Nov. 23, 2004.

Walker, J. L. B. (Ed.), *High Power GaAs FET Amplifiers*, Norwood, MA: Artech House, pp. 119-120 (1993).

Wang, et al. "Comparison of the Effect of Gate Dielectric Layer on 2DEG Carrier Concentration in Srained AlGaN/GaN Heterostructure," *Mater Res. Soc. Symp. Proc.*, vol. 831, 2005.

Wetzel, et al. "GaN, AlN, InN and Their Alloys," Symposium E., held Nov. 29-Dec. 3, 2004, to be published in vol. 831, Mat. Res. Soc. Symp. Proc. (Publication date of Abstracts unknown).

Wu et al., "3.5-Watt AlGaN/GaN HEMTs and Amplifiers at 35 GHz," IEDM-2003, Cree, Inc.

Wu et al., "3.5-Watt AlGaN/GaN HEMTs and Amplifiers at 35 GHz," Cree Santa Barbara Technology Center, Goleta, CA 93117.

Wu et al., "30-W/mm GaN HEMTs by Field Plate Optimization," *IEEE Electron Device Letters*, 25(3), pp. 117-119 (Mar. 2004).

Wu et al., "Bias-dependent Performance of High-Power AlGaN/GaN HEMTs," *IEDM Technical Digest*, p. 378-380 (2001).

Wu et al., "Linearity Performance of GaN HEMTs With Field Plates," DRC 2004, Cree, Inc.

Wu et al., "Linearity Performance of GaN HEMTs With Field Plates," Cree Santa Barbara Technology Center, Goleta, CA 93117.

Yu et al., "Schottky Barrier Engineering in III-V Nitrides via the Piezoelectric Effect," *Applied Physics Letters*, 73(13), pp. 1880-1882 (Sep. 28, 1998).

Zhang et al., "High Breakdown GaN HEMT with Overlapping Gate Structure," *IEEE Electron Device Letters*, 21(9), pp. 421-423 (Sep. 2000).

Zimmer, K., "Etching of Fused Silica and Glass with Excimer Laser at 351 nm," Applied Surface Science 208-209 (2003) pp. 199-204.

Wu et al. "30-W/mm GaN HEMTs by Field Plate Optimization," *IEEE Electron Device Letters*. vol. 25, No. 3, pp. 117-119 (Mar. 2004).

Wu et al. "High Al-Content AlGaN/GaN MODFET's for Ultrahigh Performance," *IEEE Electron Device Letters*. vol. 19, No. 2, pp. 50-53 (Feb. 1998).

Yu et al. "Schottky barrier engineering in III-V nitrides via the piezoelectric effect," *Applied Physics Letters*. vol. 73, No. 13, pp. 1880-1882, (Sep. 1998).

United States Patent Application entitled "Co-Doping for Fermi Level Control in Semi-Insulating Group III Nitrides," filed Jan. 7, 2004.

United States Patent Application entitled "Nitride Heterojunction Transistors Having Charge-Transfer Induced Energy Barriers and Methods of Fabricating the Same," filed Feb. 5, 2004.

Notice Preliminary Rejection Corresponding to Korean Patent Application No. 10-2011-7014251; Dated: Jul. 26, 2011; 4 pages, English Translation thereof, 3 pages.

European Communication Corresponding to Application No. 04 789 143.7; Dated Dec. 22, 2011; 5 pages.

\* cited by examiner

GROUP III NITRIDE SEMICONDUCTOR DEVICES WITH SILICON NITRIDE LAYERS AND METHODS OF MANUFACTURING SUCH DEVICES

CLAIM OF PRIORITY

This application claims priority under 35 U.S.C. §120 as a continuation of U.S. patent application Ser. No. 11/286,805, filed Nov. 23, 2005, now U.S. Pat. No. 7,901,994, which claims priority under 35 U.S.C. §120 as a continuation-in-part application of U.S. patent application Ser. No. 10/758,871, filed on Jan. 16, 2004, now U.S. Pat. No. 7,045,404, the disclosures of each of which are hereby incorporated by reference herein as if set forth in their entireties.

STATEMENT OF GOVERNMENT INTEREST

This invention was made with Government support under Contract No. FA8650-04-C-7146 from the Air Force Research Laboratory. The Government has certain rights in this invention.

FIELD OF THE INVENTION

The present invention relates to semiconductor devices and, more particularly, to semiconductor devices that include silicon nitride protective and/or passivation layers and methods of making such devices.

BACKGROUND

Materials such as silicon (Si) and gallium arsenide (GaAs) have found wide application in semiconductor devices for lower power and (in the case of Si) lower frequency applications. These semiconductor materials may be less well suited for higher power and/or high frequency applications, however, because of their relatively small bandgaps (e.g., 1.12 eV for Si and 1.42 for GaAs at room temperature) and/or relatively small breakdown voltages.

For high power, high temperature and/or high frequency applications and devices, wide bandgap semiconductor materials such as silicon carbide (2.996 eV bandgap for alpha SiC at room temperature) and the Group III nitrides (e.g., 3.36 eV bandgap for GaN at room temperature) are often used. These materials, typically, have higher electric field breakdown strengths and higher electron saturation velocities as compared to gallium arsenide and silicon.

A device of particular interest for high power and/or high frequency applications is the High Electron Mobility Transistor (HEMT), which is also known as a modulation doped field effect transistor (MODFET). These devices may offer operational advantages under a number of circumstances because a two-dimensional electron gas (2DEG) is formed at the heterojunction of two semiconductor materials with different bandgap energies, where the smaller bandgap material has a higher electron affinity. The 2DEG is an accumulation layer in the undoped (unintentionally doped), smaller bandgap material and can contain a very high sheet electron concentration in excess of, for example, $10^{13}$ carriers/cm$^2$. Additionally, electrons that originate in the wider-bandgap semiconductor transfer to the 2DEG, allowing a high electron mobility due to reduced ionized impurity scattering. This combination of high carrier concentration and high carrier mobility can give the HEMT a very large transconductance and may provide a strong performance advantage over metal-semiconductor field effect transistors (MESFETs) for high-frequency applications.

High electron mobility transistors fabricated in the gallium nitride/aluminum gallium nitride (GaN/AlGaN) material system have the potential to generate large amounts of RF power because of the combination of material characteristics that includes the aforementioned high breakdown fields, their wide bandgaps, large conduction band offset, and/or high saturated electron drift velocity. A major portion of the electrons in the 2DEG is attributed to polarization in the AlGaN. HEMTs in the GaN/AlGaN system have already been demonstrated. U.S. Pat. Nos. 5,192,987 and 5,296,395 describe AlGaN/GaN HEMT structures and methods of manufacture. U.S. Pat. No. 6,316,793, which is commonly assigned and is incorporated herein by reference, describes a HEMT device having a semi-insulating silicon carbide substrate, an aluminum nitride buffer layer on the substrate, an insulating gallium nitride layer on the buffer layer, an aluminum gallium nitride barrier layer on the gallium nitride layer, and a passivation layer on the aluminum gallium nitride active structure.

The passivation layer in HEMT devices has traditionally been formed on the top surface of the barrier layer in an ex-situ manner, meaning in a different reactor chamber after removal of the device from the epitaxial growth reactor. This may result in small pit formation in the barrier layer at points where screw and edge dislocations traverse the interface between the channel and barrier layers. The diameter of these pit openings are small (e.g., on the order of twice the thickness of the barrier layer), but clearly discernable on a 2×2 micron-square AFM scan.

Another step in the fabrication of nitride-based transistors is the formation of ohmic contacts for such transistors. The formation of ohmic contacts has, typically, required high annealing temperatures (e.g. 750° C.). Such high annealing temperatures may damage the materials and/or the device.

For example, in conventional devices utilizing high annealing temperatures when forming ohmic contacts, the sheet resistance of a gate region (defined as the active device region between the two contacts) of AlGaN and/or GaN layers typically increases in comparison to sheet resistances of the AlGaN and/or GaN layers as-grown. Such an increase in sheet resistance is believed to detrimentally affect the device.

U.S. Pat. No. 6,498,111 discloses a method for protecting the surface of a semiconductor material from damage and dopant passivation in which a barrier layer of dense material is deposited on the semiconductor material shortly after growth in a growth reactor such as a MOCVD reactor, using the MOCVD source gases. This barrier layer blocks the diffusion of hydrogen into the material. The reactor is then cooled in a reactive or non-reactive ambient gas. The semiconductor material is then removed from the reactor with little or no passivation of the dopant species. The barrier layer may comprise a silicon nitride layer. The Proceedings from the MRS Fall 2004 Meeting, Symposium E (GaN, AlN, InN and Their Alloys), Vol. 831 (Vol. 831 Abstracts due by Jun. 22, 2004, Meeting held November 29-Dec. 3, 2004), Abstract E6.7 and E8.20 discuss AlGaN/GaN HEMTs that include an SiO$_2$ or Si$_3$N$_4$ passivation by both PECVD and by in-situ MOCVD of the top AlGaN surface as a way of improving device performance, and reported that 2DEG carrier concentration increased strongly with increasing Si$_3$N$_4$ thickness, varying from 0 to 15 nm.

SUMMARY OF THE INVENTION

Pursuant to embodiments of the present invention, methods of fabricating transistors are provided in which a first Group III nitride layer is formed on a substrate in a reactor. A second Group III nitride layer is formed on the first Group III nitride layer. An insulating layer is formed on the second Group III nitride layer in-situ in the reactor. Thereafter, the substrate including the first Group III nitride layer, the second group III nitride layer and the insulating layer is removed from the reactor, and the insulating layer is patterned to form at least a first contact hole that exposes a first contact region of the second Group III nitride layer. A contact is then formed on the first contact region of the second Group III nitride layer. In embodiments of the present invention, the insulating layer may be a silicon nitride layer.

In these methods, the silicon nitride layer may be formed at a growth rate of at least about 0.2 microns/hour. The hydrogen concentration in the silicon nitride layer may be less than about $1 \times 10^{22}$ atoms/cm$^3$, and/or the oxygen concentration in the silicon nitride layer may be less than about $3 \times 10^{19}$ atoms/cm$^3$. The silicon nitride layer may be directly on the second Group III nitride layer, and the surface of the second Group III nitride layer adjoining the silicon nitride layer may have a pit density of less than about 0.25 pits per μm$^2$. In other embodiments, even lower pit densities such as, for example, pit densities of about 0.01 pits per μm$^2$ or about 0.001 pits per μm$^2$ may be provided. The silicon nitride layer may be formed using a high purity silicon gas (e.g., 99.99% pure) source, and/or may have a thickness of at least about 250 Angstroms. The silicon nitride layer may have a wet chemical etch rate in buffered oxide etch of less than about 10 Angstroms per minute.

In certain embodiments, the transistor may comprise a High Electron Mobility Transistor, and the first Group III nitride layer may be a Group III nitride channel layer and the second Group III nitride layer may be a Group III nitride barrier layer. In such embodiments, the sheet resistance of the Group III nitride channel layer following formation of the metal contacts may be less than about two times the sheet resistance of the Group III nitride channel layer as grown. In other embodiments, the sheet resistance of the Group III nitride channel layer following formation of the metal contacts may be less than about 1.1 times the sheet resistance of the Group III nitride channel layer as grown.

Pursuant to further embodiments of the present invention, transistors are provided that include a Group III nitride channel, a Group III nitride barrier layer on the channel, a silicon nitride layer on a first portion of the Group III nitride barrier layer, first and second ohmic contacts on respective second portions of the Group III nitride barrier layer and a gate contact on the Group III nitride barrier layer that extends through the silicon nitride layer. In these transistors, the hydrogen concentration in the silicon nitride layer is less than about $3 \times 10^{21}$ atoms/cm$^3$. In certain embodiments, the oxygen concentration in the silicon nitride layer may also be less than about $3 \times 10^{19}$ atoms/cm$^3$.

In specific embodiments, the silicon nitride layer may have a thickness of at least about 200 Angstroms. The silicon nitride layer may also have a wet chemical etch rate in buffered oxide etch (BOE) of less than about 10 Angstroms per minute. The sheet resistance of the Group III nitride channel may be less than about 1000 Ohms per square.

In some embodiments of these transistors, the silicon nitride layer is directly on the Group III nitride barrier layer, and the surface of the Group III nitride barrier layer adjoining the silicon nitride layer has a pit density of less than about 0.25 pits per μm$^2$. The transistors may also have a carbon concentration in the silicon nitride layer that is less than about $5 \times 10^{18}$ atoms/cm$^3$, a fluorine concentration that is less than about $5 \times 10^{17}$ and/or a chlorine concentration that is less than about $8 \times 10^{16}$.

In additional embodiments of the present invention, transistors are provided that include a Group III nitride channel, a Group III nitride barrier layer on the channel, a silicon nitride layer on a first portion of the Group III nitride barrier layer, first and second ohmic contacts on respective second portions of the Group III nitride barrier layer and a gate contact on the Group III nitride barrier layer that extends through the silicon nitride layer. The silicon nitride layer is directly on the channel, and the surface of the channel adjoining the silicon nitride layer has a pit density of less than about 0.25 pits per μm$^2$.

In certain embodiments of these transistors, the hydrogen concentration in the silicon nitride layer is less than about $3 \times 10^{21}$ atoms/cm$^3$, and/or the oxygen concentration in the silicon nitride layer is less than about $3 \times 10^{19}$ atoms/cm$^3$. The silicon nitride layer may have a thickness of at least about 300 Angstroms, and/or the sheet resistance of the Group III nitride channel is less than about 1000 Ohms per square.

In yet other embodiments of the present invention, methods of fabricating a Group III nitride semiconductor device are provided in which a first Group III nitride semiconductor layer doped with silicon is formed on a substrate using a source material containing a Group III metal, a source material containing nitrogen and a first silicon gas source. A silicon nitride layer is then formed on the Group III nitride semiconductor layer using a second silicon gas source wherein the second silicon gas source has a higher silicon concentration than the first silicon gas source.

In these methods, the first Group III nitride semiconductor layer and the first silicon nitride layer may be formed via MOCVD. The Group III nitride semiconductor device may, for example, be a HEMT transistor having a channel layer and a barrier layer on the channel layer, and the silicon nitride layer may be formed via MOCVD in-situ in the reactor on the barrier layer.

The silicon nitride layer may be formed on the Group III nitride semiconductor layer at a growth rate of at least about 0.2 microns/hour. The hydrogen concentration in the silicon nitride layer may be less than about $3 \times 10^{21}$ atoms/cm$^3$, and/or the oxygen concentration in the silicon nitride layer may be less than about $3 \times 10^{19}$ atoms/cm$^3$. The silicon nitride layer may have a thickness, for example, of at least about 250 Angstroms.

DETAILED DESCRIPTION

Figure 1A:
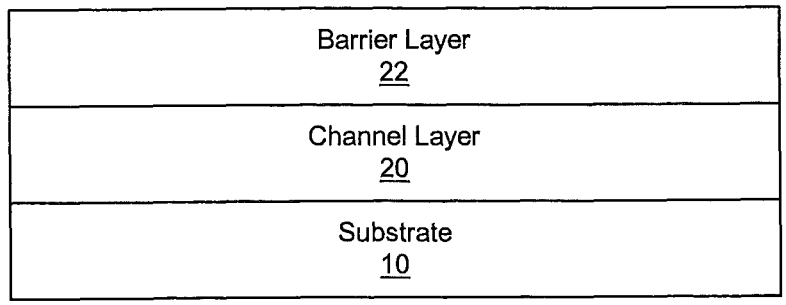
FIGS. 1A-1F are schematic drawings illustrating fabrication of transistors according to embodiments of the present invention.

Embodiments of the present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (i.e., "between" versus "directly between", "adjacent" versus "directly adjacent", etc.).

Relative terms such as "below" or "above" or "upper" or "lower" or "horizontal" or "vertical" may be used herein to describe a relationship of one element, layer or region to another element, layer or region as illustrated in the figures. It will be understood that these terms are intended to encompass different orientations of the device in addition to the orientation depicted in the figures.

Embodiments of the invention are described herein with reference to cross-section illustrations that are schematic illustrations of idealized embodiments (and intermediate structures) of the invention. The thickness of layers and regions in the drawings may be exaggerated for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this disclosure and the relevant art and will not be interpreted in an idealized or overly formal sense unless expressly so defined herein.

Embodiments of the present invention utilize a protective layer and/or a low damage recess fabrication technique to reduce gate leakage and/or provide a high quality Schottky contact in a semiconductor device, such as a transistor. The use of a protective layer may reduce damage to the semiconductor in the gate region of the transistor that may occur during an anneal of ohmic contacts of the device. Thus, high quality gate and ohmic contacts may be provided with reduced degradation of the gate region that may result from formation of the ohmic contacts.

Embodiments of the present invention may be particularly well suited for use in nitride-based HEMTs such as Group III-nitride based devices. As used herein, the term "Group III nitride" refers to those semiconducting compounds formed between nitrogen and the elements in Group III of the periodic table, usually aluminum (Al), gallium (Ga), and/or indium (In). The term also refers to ternary and quaternary (or higher) compounds such as, for example, AlGaN and AlInGaN. As is well understood by those in this art, the Group III elements can combine with nitrogen to form binary (e.g., GaN), ternary (e.g., AlGaN, AlInN), and quaternary (e.g., AlInGaN) compounds. These compounds all have empirical formulas in which one mole of nitrogen is combined with a total of one mole of the Group III elements. Accordingly, formulas such as $Al_xGa_{1-x}N$ where $0 \leq x1$ are often used to describe them.

Further embodiments of the present invention provide high quality silicon nitride layers that may have reduced impurity levels and Group III nitride based HEMTs that include such silicon nitride layers. Herein, the term "silicon nitride" and the term "SiN" are meant to encompass both stoichiometric and non-stoichiometric silicon nitride. Additional embodiments of the present invention provide devices such as Group III nitride HEMTs having uppermost Group III nitride layers that have reduced pitting. Methods of making such high quality silicon nitride layers and improved HEMTs are also disclosed herein.

Suitable structures for GaN-based HEMTs that may utilize embodiments of the present invention are described, for example, in commonly assigned U.S. Pat. Nos. 6,316,793, 6,548,333, 6,849,882, and U.S. patent application Ser. No. 10/617,843 filed Jul. 11, 2003 for "NITRIDE-BASED TRANSISTORS AND METHODS OF FABRICATION THEREOF USING NON-ETCHED CONTACT RECESSES," the disclosures of each of which are hereby incorporated herein by reference in their entirety.

Fabrication of embodiments of the present invention is schematically illustrated in FIGS. 1A-1E. As seen in FIG. 1A, a substrate 10 is provided on which nitride based devices may be formed. In particular embodiments of the present invention, the substrate 10 may be a semi-insulating silicon carbide (SiC) substrate that may be, for example, 4H polytype of silicon carbide. Other silicon carbide candidate polytypes include the 3C, 6H, and 15R polytypes. The term "semi-insulating" is used descriptively rather than in an absolute sense. In particular embodiments of the present invention, the silicon carbide bulk crystal has a resistivity equal to or higher than about $1 \times 10^5$ Ω-cm at room temperature.

Optional buffer, nucleation and/or transition layers (not shown) may be provided on the substrate 10. For example, an AlN buffer layer may be provided to provide an appropriate crystal structure transition between the silicon carbide substrate and the remainder of the device. Additionally, strain balancing transition layer(s) may also be provided as described, for example, in commonly assigned United States Patent Publication 2003/0102482A1, filed Jul. 19, 2002 and published Jun. 5, 2003, and entitled "STRAIN BALANCED NITRIDE HETROJUNCTION TRANSISTORS AND METHODS OF FABRICATING STRAIN BALANCED NITRIDE HETEROJUNCTION TRANSISTORS, and U.S. Provisional Patent Application Ser. No. 60/337,687, filed Dec. 3, 2001 and entitled "STRAIN BALANCED NITRIDE HETEROJUNCTION TRANSISTOR," the disclosures of which are incorporated herein by reference as if set forth fully herein.

Silicon carbide has a much closer crystal lattice match to Group III nitrides than does sapphire ($Al_2O_3$), which is a very common substrate material for Group III nitride devices. The closer lattice match may result in Group III nitride films of higher quality than those generally available on sapphire. Silicon carbide also has a very high thermal conductivity so that the total output power of Group III nitride devices on silicon carbide is, typically, not as limited by thermal dissipation of the substrate as in the case of the same devices formed on sapphire. Also, the availability of semi-insulating silicon carbide substrates may provide for device isolation and reduced parasitic capacitance. Appropriate SiC substrates are manufactured by, for example, Cree, Inc., of Durham, N.C., the assignee of the present invention, and methods for producing are described, for example, in U.S. Pat. Nos. Re. 34,861; 4,946,547; 5,200,022; and 6,218,680, the contents of which are incorporated herein by reference in their entirety. Similarly, techniques for epitaxial growth of Group III nitrides have been described in, for example, U.S. Pat. Nos. 5,210,051; 5,393,993; 5,523,589; and 5,292,501, the contents of which are also incorporated herein by reference in their entirety.

Although silicon carbide may be used as a substrate material, embodiments of the present invention may utilize any suitable substrate, such as sapphire, aluminum nitride, aluminum gallium nitride, gallium nitride, silicon, GaAs, LGO, ZnO, LAO, InP and the like. In some embodiments, an appropriate buffer layer also may be formed.

Returning to FIG. 1A, a channel layer 20 is provided on the substrate 10. The channel layer 20 may be deposited on the substrate 10 using buffer layers, transition layers, and/or nucleation layers as described above. The channel layer 20 may be under compressive strain. Furthermore, the channel layer and/or buffer nucleation and/or transition layers may be deposited by MOCVD or by other techniques known to those of skill in the art, such as MBE or HYPE.

In some embodiments of the present invention, the channel layer 20 is a Group III nitride, such as $Al_xGa_{1-x}N$ where $0 \leq x < 1$, provided that the energy of the conduction band edge of the channel layer 20 is less than the energy of the conduction band edge of the barrier layer 22 at the interface between the channel and barrier layers. In certain embodiments of the present invention, x=0, indicating that the channel layer 20 is GaN. The channel layer 20 may also be other Group III-nitrides such as InGaN, AlInGaN or the like. The channel layer 20 may be undoped ("unintentionally doped") and may be grown to a thickness of greater than about 20 Å. The channel layer 20 may also be a multi-layer structure, such as a superlattice or combinations of GaN, AlGaN or the like.

A barrier layer 22 is provided on the channel layer 20. The channel layer 20 may have a bandgap that is less than the bandgap of the barrier layer 22 and the channel layer 20 may also have a larger electron affinity than the barrier layer 22. The barrier layer 22 may be deposited on the channel layer 20. In certain embodiments of the present invention, the barrier layer 22 is AlN, AlInN, AlGaN or AlInGaN or combinations of layers thereof. The barrier layer 22 may, for example, be from about 0.1 nm to about 10 nm thick, but is not so thick as to cause cracking or substantial defect formation therein. In certain embodiments of the present invention, the barrier layer 22 is undoped or doped with an n-type dopant to a concentration less than about $10^{19}$ cm$^{-3}$. In some embodiments of the present invention, the barrier layer 22 is $Al_xGa_{1-x}N$ where $0 < x < 1$. In particular embodiments, the aluminum concentration is about 25%. However, in other embodiments of the present invention, the barrier layer 22 comprises AlGaN with an aluminum concentration of between about 5% and about 100%. In specific embodiments of the present invention, the aluminum concentration is greater than about 10%.

Examples of layers according to certain embodiments of the present invention are described in U.S. Pat. No. 6,849,882, the disclosure of which is incorporated herein by reference as if set forth fully herein. In particular embodiments of the present invention, the barrier layer 22 is thick enough and has a high enough Al composition and doping to induce a significant carrier concentration at the interface between the channel layer 20 and the barrier layer 22 through polarization effects when the barrier layer 22 is buried under ohmic contact metal. Also, the barrier layer 22 may be thick enough to reduce or minimize scattering of electrons in the channel due to ionized impurities deposited at the interface between the barrier layer 22 and a second cap layer 24 (FIG. 1B).

Figure 1B:
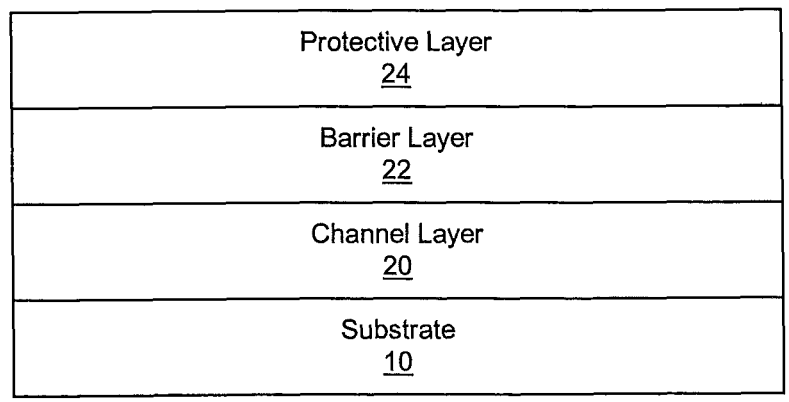

FIG. 1B illustrates formation of a protective layer 24 on the barrier layer 22. The protective layer 24 may be silicon nitride ($Si_xN_y$), aluminum nitride (AlN) and/or other suitable protective material, such as silicon dioxide ($SiO_2$) and/or an oxynitride. Other materials may also be utilized for the protective layer 24 as long as the material may be removed without damaging the underlying barrier layer 22. For example, the protective layer 24 could also include magnesium oxide, scandium oxide, aluminum oxide and/or aluminum oxynitride. Furthermore, the protective layer 24 may be a single layer or multiple layers of uniform and/or non-uniform composition.

In particular embodiments of the present invention, the protective layer 24 is SiN. The SiN may be formed by PVD and/or CVD and may be non-stoichiometric in compressive or tensile strain. For example, the protective layer may have a stress of between about −100 MPa and about 100 MPa. In certain embodiments of the present invention, the SiN protective layer has an index of refraction at a 633 nm wavelength of from about 1.6 to about 2.2. In particular embodiments, the index of refraction of the SiN protective layer is 1.98±0.05.

In certain embodiments, the protective layer 24 may be AlN. The AlN may be formed by PVD and/or CVD and may be non-stoichiometric in compressive or tensile strain. For example, the protective layer may have a stress of between about −100 MPa and about 100 MPa. In certain embodiments of the present invention, the AlN protective layer has an index of refraction at a 633 nm wavelength from about 1.8 to about 2.1. In particular embodiments, the index of refraction of the AlN protective layer is 1.85±0.05.

The protective layer 24 may also be $SiO_2$. The $SiO_2$ may be formed by PVD and/or CVD and may be non-stoichiometric in compressive or tensile strain. For example, the protective layer may have a stress of between about −100 MPa and about 100 MPa. In certain embodiments of the present invention, the $SiO_2$ protective layer has an index of refraction at a 633 nm wavelength of from about 1.36 to about 1.56. In particular embodiments, the index of refraction of the $SiO_2$ protective layer is 1.46±0.03.

The protective layer 24 may be blanket formed on the barrier layer 22 and may be formed by deposition. For example, a silicon nitride layer may be formed by high quality sputtering and/or PECVD. Typically, the protective layer 24 may have a thickness of about 30 nm, however, other thickness layers may also be utilized. For example, the protective layer should be sufficiently thick so as to protect the underlying layer during a subsequent anneal of ohmic contacts. Layers as thin as two or three monolayers may be sufficient for such purposes. However, in general, the protective layer 24 may have a thickness of from about 10 nm to about 500 nm. Also, a high quality SiN protective layer may be grown in-situ with the MOCVD growth of the group III nitride layers.

Figure 1C:
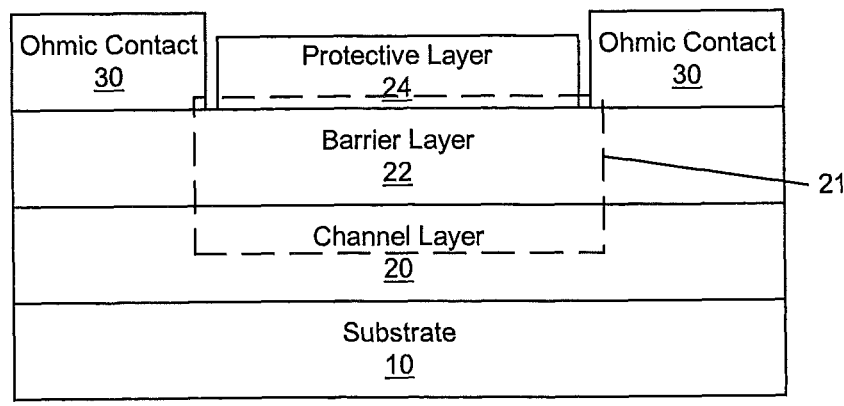

As illustrated in FIG. 1C, windows are opened in the protective layer 24 for formation of ohmic contacts 30. The windows may be formed utilizing a patterned mask and a low damage etch with respect to the barrier layer 22 to expose the underlying barrier layer 22. Examples of low damage etch techniques include etching techniques other than reactive ion etching, such as inductively coupled plasma or electron cyclotron resonance (ECR) or downstream plasma etching with no DC component to the plasma. For $SiO_2$, a low damage etch could be a wet etch with buffered hydrofluoric acid. A selective etch of SiN and/or $SiO_2$ to an etch stop layer, such as ITO, SCO, MgO or the like, followed by a low damage removal of the etch stop layer could also be performed. For SiN, $SiO_2$ may be used as an etch stop layer. In such embodiments, the protective layer 24 may include the SiN, AlN and/or $SiO_2$ layer as well as the etch stop layer. Thus, in certain embodiments of the present invention, the protective layer 24 may include multiple layers.

As is further illustrated in FIG. 1C, with a subsequent photolithography step and evaporation, ohmic metal is patterned to provide the ohmic contacts 30. The ohmic contacts 30 are patterned so as to be smaller than the window in the protective layer 24 such that the edges of the ohmic contacts 30 are spaced apart from the protective layer 24. For example, the edges of the ohmic contacts 30 may be spaced apart from the protective layer 24 by a distance of from about 0.1 to about 0.2 μm. The ohmic contacts 30 should be spaced apart from the protective layer 24 a distance sufficiently large to allow for misalignment tolerances in the formation and patterning of the ohmic contact metal. If the ohmic contact metal contacts the protective layer 24, the metal may diffuse into the protective layer 24 during subsequent heating steps which may result in a short between a gate contact and the ohmic contact (s) 30. However, the gap between the ohmic contacts 30 and the protective layer 24 should not be so large as to defeat the protective purpose of the protective layer 24 and, thereby, substantially degrade the performance of the device but should not be so small to risk random contact of ohmic material to the protective layer. Thus, for example, in certain embodiments of the present invention, the gap may be from about 0.1 μm to about 0.5 μm.

The ohmic contact material is annealed to provide the ohmic contacts 30. The anneal may be a high temperature anneal. For example, the anneal may be an anneal at a temperature of greater than about 900° C. Through the use of an ohmic contact anneal, the resistance of the ohmic contacts may be reduced from a high resistance to less than about 1 Ω-mm. Thus, as used herein, the term "ohmic contact" refers to a non-rectifying contact that has a contact resistance of less than about 1 Ω-mm. The presence of the protective layer during the high temperature process steps may inhibit damage to the barrier layer 22 that may be caused by such steps. Thus, for example, the sheet resistance of the gate region 21 after the high temperature ohmic contact anneal may be substantially the same as the sheet resistance of the gate region 21 as-grown (i.e. before the contact anneal). The sheet resistance after ohmic anneal or any other high-temperature processing may remain within 100% of the sheet resistance of the gate region 21 as-grown. In other embodiments, the sheet resistance of the gate region 21 after ohmic anneal or any other high-temperature processing may remain within about 1.1 times the sheet resistance of the gate region 21 as grown.

Figure 1D:
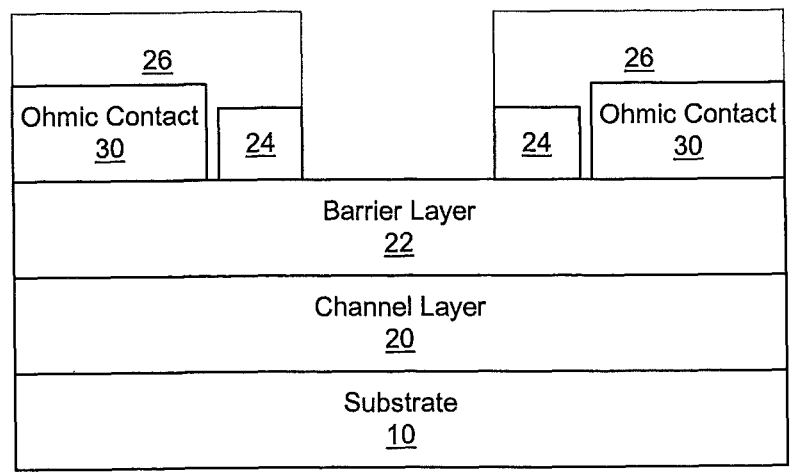

FIG. 1D illustrates the formation of a gate window. As seen in FIG. 1D, a mask 26 is formed on the ohmic contacts and the protective layer 24 and patterned to form a window that exposes a portion of the protective layer 24. A recess is then formed through the protective layer 24 to expose a portion of the barrier layer 22. The recess may be formed using the mask 26 and a low damage etch process as described above. In particular embodiments where the ohmic contacts 30 provide source and drain contacts, the recess may be offset between the source and drain contacts such that the recess, and subsequently the gate contact 32, is closer to the source contact than the drain contact.

Figure 1E:
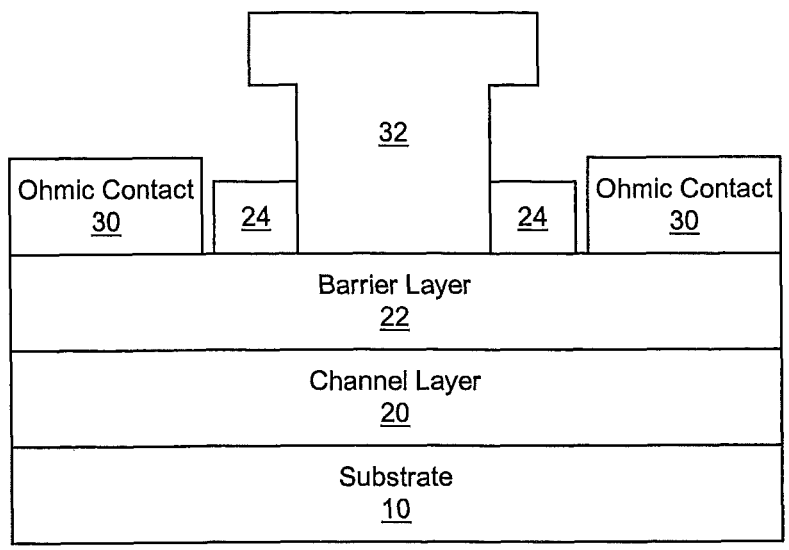

As seen in FIG. 1E, a gate contact 32 is formed in the recess and contacts the exposed portion of the barrier layer 22. The gate contact may be a "T" gate as illustrated in FIG. 1E and may be fabricated using conventional fabrication techniques. Suitable gate materials may depend on the composition of the barrier layer, however, in certain embodiments, conventional materials capable of making a Schottky contact to a nitride based semiconductor material may be used, such as Ni, Pt, $NiSi_x$, Cu, Pd, Cr, W and/or WSiN. Although it may be undesirable, it is possible that a small gap between the protective layer 24 and the gate contact 32 may arise as a result of, for example, anisotropy of the low-damage etch, resulting in an exposed surface of the barrier layer 22 between the protective layer 24 and the gate contact 32.

Figure 1F:
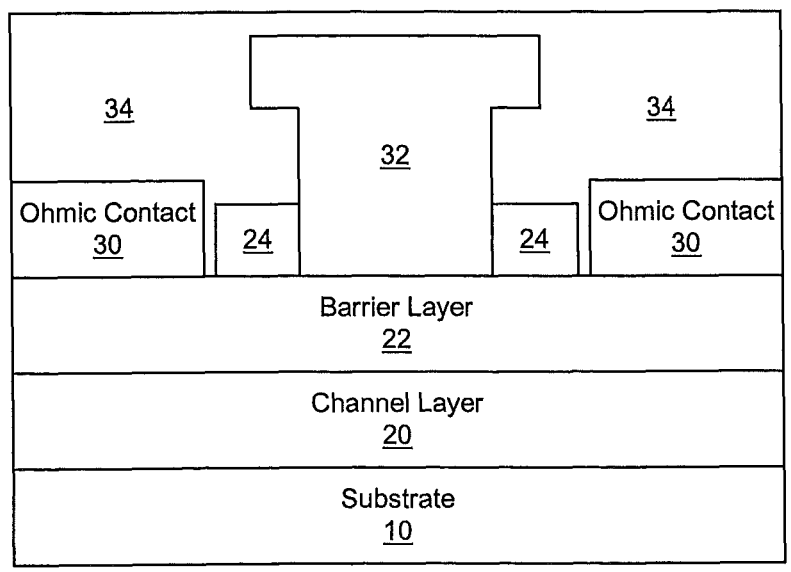

FIG. 1F illustrates the formation of a passivation layer 34. The passivation layer may be blanket deposited on the structure of FIG. 1E. In particular embodiments, the passivation layer 34 is deposited so as to substantially fill the gap between the protective layer 24 and the ohmic contacts 30 and also the gap between the protective layer 24 and the gate contact 32, if such gap exists. In certain embodiments of the present invention, the passivation layer 34 may be silicon nitride, aluminum nitride, silicon dioxide and/or an oxynitride. Furthermore, the passivation layer 34 may be a single or multiple layers of uniform and/or non-uniform composition.

Figure 2A:
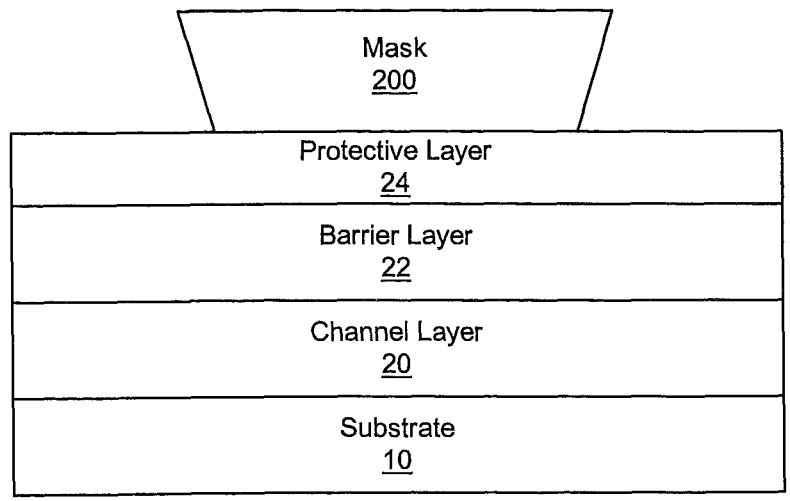
FIGS. 2A and 2B are schematic drawings illustrating operations in the fabrication of transistors according to further embodiments of the present invention.
Figure 2B:
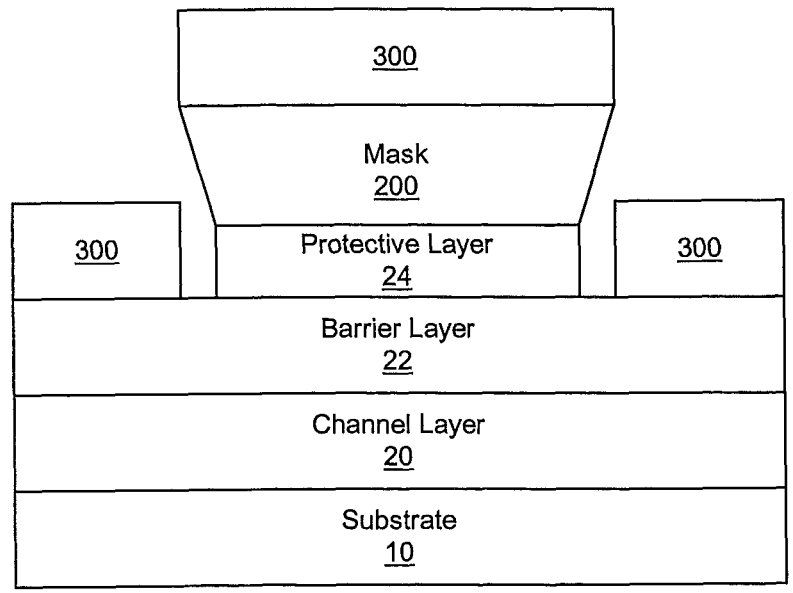

While embodiments of the present invention have been described with reference to a two mask process for forming opening gate contact windows and forming gate contacts with a gap to the protective layer 24, FIGS. 2A and 2B illustrate operations for forming the ohmic contact windows and the ohmic contacts with a single mask. As seen in FIG. 2A, a mask 200, such as a photoresist, with a negative bevel may be formed on the protective layer 24. The negative bevel of the mask 200 corresponds to the gap distance between the subsequently formed ohmic contacts 30 and the patterned protective layer 24. The protective layer 24 is isotropically etched using a low damage etch process as described above to provide the contact windows. Thus, the contact windows will be defined by the bottom dimension of the mask 200. A mask layer without a negative bevel could also be used if the etch is isotropic and the low-damage etch is substantially over etched to provide a lateral undercut to the desired spacing.

As seen in FIG. 2B, ohmic contact metal 300 is evaporated on the resulting structure. The overhang of the mask 200 defines the location where metal is deposited on the exposed barrier layer 22. Thus, the contact metal 300 is spaced apart from the patterned protective layer 24. The mask 200 and the metal 300 on the mask 200 are removed to provide the structure of FIG. 1C.

Techniques for providing a beveled mask as illustrated in FIG. 2A are known to those of skill in the art. Furthermore, while the mask 200 is shown as having a bevel, in other embodiments of the present invention, the mask may have a step or other such configuration that provides a mask with two different apparent window sizes for the etch of the protective layer 24 and the deposition of contact material. Thus, for example, multi-layer photoresists are available that have different exposure sensitivity such that a single exposure may provide a mask with an overhang or step such that the window provided by the layer of photoresist proximate the protective layer 24 is large than a window provided by the layer of photoresist spaced apart from the protective layer 24.

Figure 3:
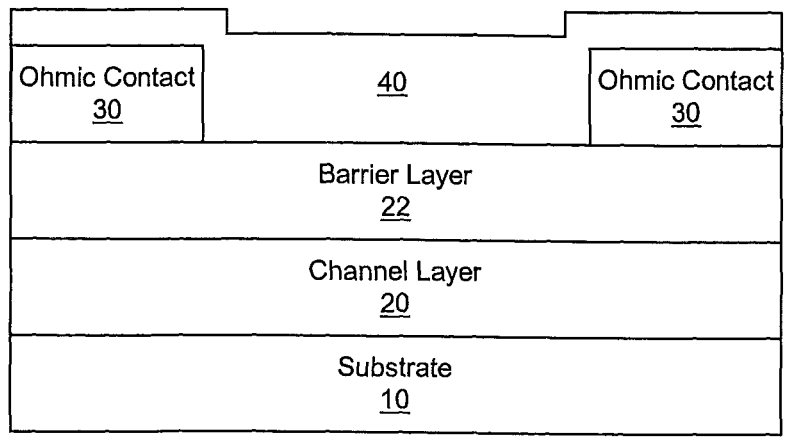
FIG. 3 is a schematic illustration of an alternative fabrication step according to embodiments of the present invention.

FIG. 3 illustrates fabrication of transistors according to further embodiments of the present invention. As seen in FIG. 3, the formation of the protective layer 24 prior to ohmic metal deposition may be omitted and the ohmic metal may be deposited and patterned on the barrier layer 22 to provide ohmic contact material regions 30 on the barrier layer 22. A protective layer 40 is then formed on the gate region of the barrier layer 22 and the ohmic contact material. In particular embodiments of the present invention, the protective layer 40 may be aluminum nitride that is blanket deposited by sputtering. The protective layer 40 may also be materials such as described above with reference to the protective layer 24.

The anneal of the ohmic contact material regions 30 is carried out with the protective layer 40 in place. The protective layer 40 may then be removed, for example, using a low damage etching technique such as those described above. The gate contact 32 may then be formed, before or after formation of a passivation layer 34. For example, a layer of silicon nitride could be deposited by sputtering. A gate recess could then be etched, for example, using a low damage etch process as described above, into the passivation layer and the gate formed in the recess. Such a process may provide for the silicon nitride passivation layer maintaining its full thickness to the edge of the "T" gate. Thus, a transistor having a structure such as that illustrated in FIG. 4 may be provided.

Figure 4:
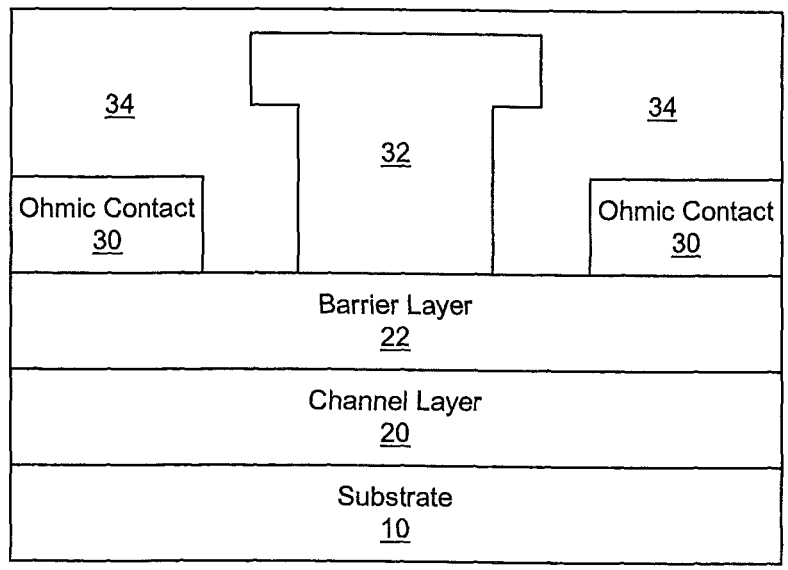
FIG. 4 is a schematic illustration of transistors according to further embodiments of the present invention.

Alternatively, the structure illustrated in FIG. 4 may be provided utilizing the fabrication steps illustrated in FIGS. 1A-1F, however, the protective layer 24 may be removed either prior to or subsequent to the formation of the gate contact 32. In such a case, the protective layer 24 should be removed using low damage etching techniques such as those described above.

Figure 5:
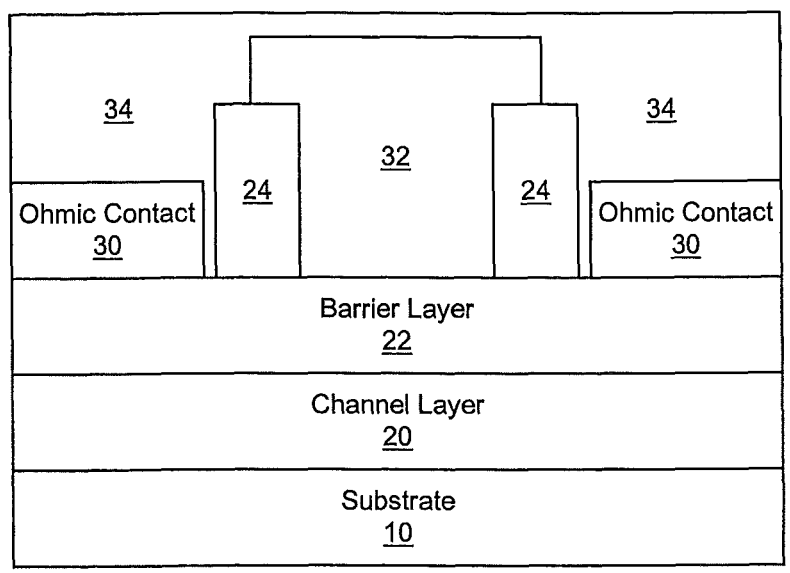
FIG. 5 is a schematic illustration of transistors according to still further embodiments of the present invention.

FIG. 5 illustrates further embodiments of the present invention where the protective layer 24 is formed to at least about as thick as the ohmic contacts 30. As seen in FIG. 5, in such embodiments, the wings of the gate contact 34 may be formed directly on the protective layer 24. For example, the protective layer 24 may be formed to a thickness of from about 500 to about 5000 Å. A low damage etch through the protective layer 24 would be carried out and the "T" gate 32 formed directly on and through the protective layer 24. Subsequent overlayer passivation 34 may also be provided, for example, to improve environmental protection of the device.

While embodiments of the present invention have been described herein with reference to particular HEMT structures, the present invention should not be construed as limited to such structures. For example, additional layers may be included in the HEMT device while still benefiting from the teachings of the present invention. Such additional layers may include GaN cap layers, as for example, described in Yu et al., "Schottky barrier engineering in III-V nitrides via the piezoelectric effect," Applied Physics Letters, Vol. 73, No. 13, 1998, or in U.S. Pat. No. 6,548,333, the disclosures of which are incorporated herein by reference as if set forth fully herein. In some embodiments, insulating layers such as SiNx, or relatively high quality AlN may be deposited for making a MISHEMT and/or passivating the surface. The additional layers may also include a compositionally graded transition layer or layers.

Furthermore, the barrier layer 22 may also be provided with multiple layers as described in U.S. Pat. No. 6,849,882, the disclosure of which is incorporated herein by reference as if set forth fully herein. Thus, embodiments of the present invention should not be construed as limiting the barrier layer to a single layer but may include, for example, barrier layers having combinations of GaN, AlGaN and/or AlN layers. For example, a GaN, AlN structure may be utilized to reduce or prevent alloy scattering. Thus, embodiments of the present invention may include nitride based barrier layers, such nitride based barrier layers may include AlGaN based barrier layers, AlN based barrier layers and combinations thereof.

As noted above, pursuant to certain embodiments of the present invention, SiN protective layers and/or passivation layers (or other insulating layers) may be grown on a semiconductor device in-situ. By the term "in-situ", it is meant that the SiN layer is grown on the device without removing the device from the reactor that is used to grow at least the immediately underlying layer of the device. By way of example, in certain embodiments of the present invention that are discussed above, SiN protective layers and/or passivation layers are grown in-situ by MOCVD after the MOCVD growth of various Group III nitride layers. This may be accomplished, for example, by depositing the SiN layer(s) immediately after the growth of the Group III nitride layers is completed. For example, in embodiments of the present invention in which the Group III nitride layers are grown using metalorganics and $NH_3$ source gases, the metalorganic gas source(s) may be switched off while the $NH_3$ source gas continues to flow. A silicon source such as, for example, pure SiH$_4$ may then be turned on to start immediate or almost immediate growth of the SiN layer on the top surface of the last grown Group III nitride layer. By starting growth of the SiN layer(s) with little or no delay after completion of the growth of the Group III nitride layers, it may be possible to reduce and/or minimize deposition of impurities at the interface between the uppermost Group III nitride layer and the SiN layer. This approach may also facilitate reducing and/or minimizing decomposition of the top surface of the uppermost Group III nitride layer.

Pursuant to certain embodiments of the present invention, the in-situ grown SiN layers may be grown at high temperature (e.g., above about 800° C.). Such high temperature growth may also facilitate reducing the impurity levels in the SiN layer and at the interface between a Group III nitride layer and the SiN layer. Additionally, high growth rates may be employed which may facilitate reducing the levels of background reactor impurities incorporated into the SiN layer. For example, in certain embodiments of the present invention, the SiN layer(s) may be grown at a growth rate of at least about 0.2 microns/hour. In certain specific embodiments, the growth rate may be about 2 microns/hour.

Forming the SiN layer in-situ may also reduce the levels of impurities that are incorporated into the top surface of the uppermost Group III nitride layer and/or into the SiN layer itself. In particular, when the device is removed from the reactor and the SiN layer is formed via a post-MOCVD growth process such as, for example, sputtering or PECVD, a number of different mechanisms may introduce impurities. For example, as discussed in detail in U.S. Pat. No. 6,498,111, if hydrogen is present in an MOCVD reactor during the growth of a Group III nitride layer, the hydrogen may tend to incorporate into the Group III nitride layer during cooling of the reactor following growth. Likewise, exposure of the device to the atmosphere upon removal from the reactor may allow for incorporation of oxygen atoms, and various other impurities may be introduced, particularly adjacent the outer surfaces of the device, as a result of handling of the device and/or chemical cleaning of the device. Impurities may also be added if post-growth processing such as wet etching, electrode deposition, annealing steps, etc. are performed prior to deposition of the SiN protective/passivation layer. These impurities may change the surface states at the interface between the Group III nitride layer and the SiN layer in ways that may be undesirable and/or difficult to control/reproduce. For example, the presence of impurities can increase trapping at the interface between the SiN layer and the underlying Group III nitride layer, thereby reducing the sheet resistance of the channel. Moreover, as discussed herein, the formation of pits in the layer underlying the SiN layer (e.g., a barrier layer) may be reduced and/or minimized by growing the SiN layer in-situ.

In certain embodiments of the present invention, a high purity silicon gas source (e.g., pure silane or SiH$_4$) may be used as a source gas in the growth of the silicon nitride layer(s). As is known to persons of skill in the art, diluted (and often less pure) silicon gas sources such as, for example, diluted silane are often used as a source for silicon dopants in the growth of n-doped Group III nitride layers. Herein the term "diluted silicon gas source" refers to a silicon gas source such as, for example, silane or disilane that has been diluted with a different, often inert, gas such as, for example, hydrogen, nitrogen or argon. The ratio of the atomic Si provided by the diluted silicon gas to the Group III metal flow is less than about 0.01 for most doping applications, and typically is on the order of about 0.0001 (i.e. 100 parts per million). Since the range of mass flow controllers is often limited, a silicon gas source concentration of, for example, 0.0001 (100 parts per million) is often selected. Safety considerations may also favor use of diluted silicon gas sources, as it may be acceptable to store several hundred parts per million SiH$_4$ diluted in nitrogen inside a building, whereas with pure SiH$_4$ it may be necessary to store the gas outside or in a special bunker. Pursuant to embodiments of the present invention, a pure silicon gas source may be connected to the reactor and used as the source gas for growth of one or more of the SiN layers in a device. By a "pure silicon gas source", it is meant that the purity of the silicon source (as well as the purity of any dilution gas that may be mixed with or included in the silicon gas source) is at least about 99.99%, such as, for example, high purity silane available from Matheson (www.matheson-trigas.com) having a purity of 99.9996% or Megaclass™ Grade 5N7 high purity silane gas from AirProducts (www.airproducts.com) which is 99.9997% pure. Pure disilane (Si$_2$H$_6$) or other pure silicon gas sources may be used instead of high purity silane (SiH$_4$). The silicon containing chemical should be suitable for doping of Group III nitrides and/or for growth of silicon nitride. It will also be understood that the pure silicon gas from the pure silicon gas source may be diluted in the gas mixing system before injection into the reactor, where the pure silicon gas is further diluted with other reactants and carrier gases.

In certain embodiments of the present invention, the only detectable impurities (using conventional detection techniques) in the pure silicon gas such as the pure silane gases identified above may be hydrogen and nitrogen, which are the components of the other reactant (NH$_3$) typically used for growing silicon nitride. The silane gas may also be passed through purification media to reduce, for example, the concentration of oxygen containing species to, for example, less than about one part per billion.

The use of such a pure silicon gas source may facilitate reducing the level of impurities at, for example, the interface between the Group III nitride layer and the SiN layer and/or within the SiN layer, which may, in certain circumstances, improve the performance and/or reproducibility of the device. In particular, the higher quality (i.e., more pure) SiN layer may help reduce or minimize trapping within the body of the insulative layer, thereby providing a higher breakdown critical field. When such a pure silicon gas source is included with the reactor, it may still be desirable to include a second silicon source as well that is used as the dopant gas source during the growth of, for example, an n-doped or co-doped Group III nitride layer.

Figure 6:
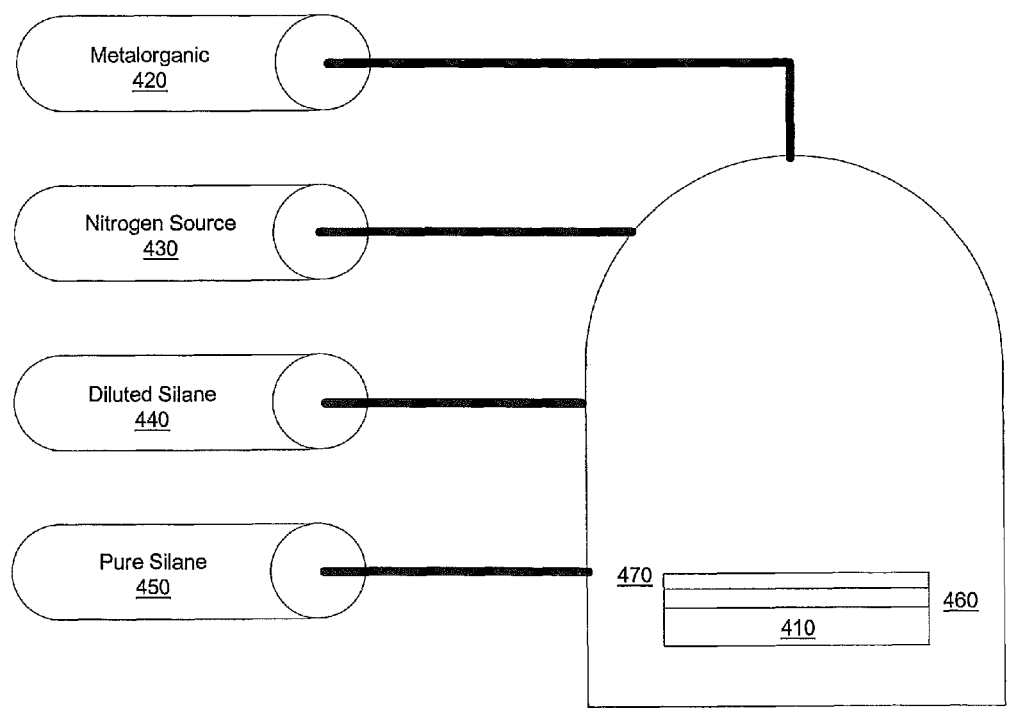
FIG. 6 is a schematic illustration of a reactor according to embodiments of the present invention.

FIG. 6 depicts a reactor 400 such as, for example, an MOCVD reactor which can be used to fabricate Group III nitride semiconductor devices that include SiN passivation and/or protection layers according to embodiments of the present invention. As shown in FIG. 6, a substrate 410 is placed in the reactor 400. The reactor has a variety of gas feeds, including at least one or more metalorganic source gas feeds 420, a nitrogen source gas (e.g., NH$_3$) feed 430, a diluted silicon source gas feed 440 and a high purity silicon gas source 450. At least the metalorganic source gas feed(s) 420 and the nitrogen source gas feed 430 are used to grow one or more Group III nitride layers 460 on the substrate 410. Some of the Group III nitride layers 460 may be doped with silicon during the growth thereof using the diluted silicon source gas 440. A SiN layer 470 may be grown using the high purity silicon gas source 450 and a nitrogen gas source (typically the nitrogen gas source feed 430) on the Group III nitride layers 460. It will be appreciated that FIG. 6 is a schematic drawing and is not intended to illustrate an actual reactor or the actual configuration of gas sources, and that FIG. 6 does not include numerous aspects of the growth system that will be appreciated by those of skill in the art.

When doping Group III nitride layers with silicon, the silicon source concentration and pressure combined with feasible flow and dilution rates may be selected to result in low enough silicon transport into the reactor compared to the Group III species such that the desired doping concentration is achieved. In contrast, pursuant to embodiments of the present invention, for the growth of silicon nitride, the silicon source concentration and pressure combined with feasible flow and dilution rates may be selected to result in a high enough silicon transport into the reactor to achieve a growth rate capable of depositing in excess of 100 nm of silicon nitride in, for example, 1 hour, as this may facilitate, for example, rapid encapsulation of the underlying Group III nitride layers, thereby reducing and/or preventing significant etching and/or contamination. Such expedited growth rates may also reduce the effects of reactor background doping (i.e., the incorporation of background impurities from the reactor into the silicon nitride layer).

As noted above, pursuant to embodiments of the present invention, HEMT transistors with in-situ grown silicon nitride protective layers are provided. The silicon nitride may be grown, for example, at a growth rate of about 2 microns/hour. A predominantly nitrogen atmosphere may be used to reduce hydrogen incorporation. In growing the silicon nitride layer, the same growth conditions used to grow the last underlying layer may be used to permit immediate switching from the Group III nitride growth to growth of the silicon nitride layer. A growth temperature of, for example, 1000° C. may be used both for the underlying Group III nitride (e.g., AlGaN) layer and for the growth of the silicon nitride layer.

Embodiments of the present invention are described below with reference to an example and comparative examples. It will be appreciated that these examples shall be regarded as merely illustrative and shall not be construed as limiting the invention.

EXAMPLE 1

The semiconductor layers of a Group III nitride based HEMT transistor were grown via MOCVD growth, and a SiN layer using pure silane and $NH_3$ source gases was grown in-situ at high temperature on the Group III nitride barrier layer of the HEMT transistor. Secondary Ion Mass Spectrometry (SIMS) analysis with a Cs ion beam was performed on the SiN layer to measure the concentrations of H, O, C, F and Cl in the SiN layer. The results of the SIMS analysis are listed in Table 1 below.

TABLE 1

| Element | Concentration in SiN Layer | Detection Limit |
| --- | --- | --- |
| H | $4 \times 10^{21}$ | $3 \times 10^{18}$ |
| O | $3 \times 10^{18}$ | $8 \times 10^{17}$ |
| C | $7 \times 10^{17}$ | $6 \times 10^{17}$ |
| F | $<1 \times 10^{16}$ | $7 \times 10^{15}$ |
| Cl | $<4 \times 10^{16}$ | $1 \times 10^{16}$ |

As shown in Table 1, the levels of C, F, Cl and, to a lesser extent, O in the SiN layer were near, at or even below the detection limit, and the hydrogen impurity levels were also low.

COMPARATIVE EXAMPLES 1 and 2

SiN layers were also grown in three comparative examples using two different growth techniques. In Comparative Example 1, the SiN layer was grown ex-situ via sputtering using a SEGI tool that uses a pulsed DC power source with a process pressure of about 3 mT. The power source reverses bias polarity periodically (e.g., 80 to 150 kHz, 1000 to 2000 ns) to discharge insulating particles that build up on the target, thus avoiding arcs. In Comparative Example 2, the SiN layer was grown ex-situ via PECVD using a UNAXIS Model 790 PECVD tool at 350° C. In each of the comparative examples, SIMS analysis was used to measure the concentrations of H, O, C, F and Cl in the SiN layer of the device grown. The results of these SIMS analyses are listed in Table 2 below.

TABLE 2

| | Concentration in SiN Layer | |
| --- | --- | --- |
| Element | SEGI Sputtering | PECVD |
| H | $3 \times 10^{21}$ | $2 \times 10^{22}$ |
| O | $2 \times 10^{21}$ | $5 \times 10^{19}$ |
| C | $2 \times 10^{19}$ to $4 \times 10^{19}$ | $2 \times 10^{18}$ |
| F | $1 \times 10^{18}$ to $20 \times 10^{18}$ | $8 \times 10^{19}$ |
| Cl | $2 \times 10^{17}$ to $100 \times 10^{17}$ | $<1 \times 10^{17}$ |

As can be seen by comparing the results in Table 1 with the results in Table 2, the SiN layer fabricated according to embodiments of the present invention in Example 1 has significantly lower overall impurity levels as compared to the SiN layers grown in Comparative Examples 1 and 2. With one exception (the H impurity levels), the impurity levels recorded in Example 1 are generally one to three orders of magnitude smaller than the impurity levels realized in each of Comparative Examples 1 and 2. Even with respect to hydrogen impurities, the SiN layer of Example 1 exhibits H levels that are nearly an order of magnitude better than the H levels in Comparative Example 2, and approximately the same as the H level in Comparative Example 1. Thus, the results of Tables 1 and 2 show that pursuant to embodiments of the present invention, HEMT transistors having SiN layers with significantly reduced impurity levels may be provided.

Another measure of the purity of the silicon nitride layers produced according to embodiments of the present invention is the Buffered Oxide Etch (BOE) etch rate of the layers. As is known to persons of skill in the art, highly pure silicon nitride layers exhibit very low BOE etch rates such as BOE etch rates of less than about 10 Angstroms per minute. In contrast, PECVD silicon nitride may have a BOE etch rate on the order of about 100 Angstroms per minute, and sputtered silicon nitride may have a BOE etch rate on the order of about 1000 Angstroms or more per minute.

Figure 7A:
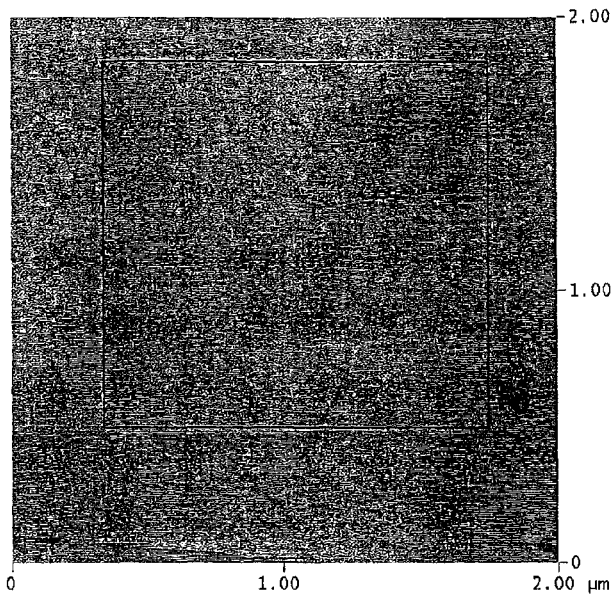
FIG. 7A is an Atomic Force Microscopy (AFM) photograph of the top surface of the uppermost Group III nitride layer of an intermediate structure formed according to embodiments of the present invention.

Pursuant to further embodiments of the present invention, Group III nitride based HEMT transistors are provided which may have reduced pit densities at the top surface of the uppermost Group III nitride layer in the device. FIG. 7A is an Atomic Force Microscopy (AFM) photograph of the top surface of the uppermost Group III nitride layer of a HEMT transistor, where a silicon nitride protective layer was grown at high temperature in-situ via MOCVD on the uppermost Group III nitride layer using a high purity silane gas source and $NH_3$. With the device depicted in FIG. 7A, the silicon nitride layer was removed after the device was taken out of the reactor, and no other post-growth processing was performed. As can be seen in FIG. 7A, no pits are visible on the upper surface of the uppermost Group III nitride layer.

Figure 7B:
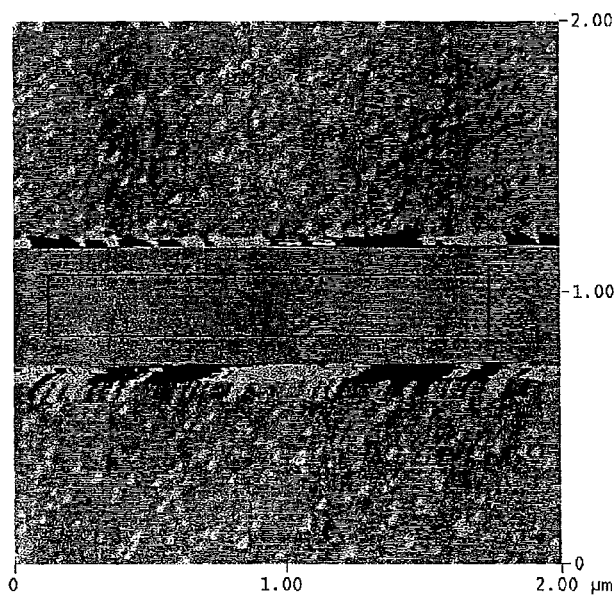
FIG. 7B is an AFM photograph illustrating the pit density on the upper surface of a Group III nitride layer of a device formed pursuant to embodiments of the present invention.

FIG. 7B is an Atomic Force Microscopy (AFM) photograph of the top surface of the uppermost Group III nitride layer of an HEMT transistor fabricated in accordance with embodiments of the present invention. The silicon nitride protective layer was grown at high temperature in-situ via MOCVD on the uppermost Group III nitride layer using a high purity silane gas source and NH$_3$. After the device was removed from the reactor, the remaining processing steps were performed to complete fabrication of the HEMT transistor (i.e., recesses were formed in the silicon nitride layer for the ohmic contacts, and metal was deposited and subsequently subjected to a high temperature anneal to form first and second ohmic contacts). Then, a portion of the silicon nitride layer was removed to expose the uppermost Group III nitride layer.

As shown in FIG. 7B, the top surface of the uppermost Group III nitride layer in the HEMT transistor according to embodiments of the present invention has no discernible enlarged pits within the exposed area of the uppermost Group III nitride layer. Pursuant to embodiments of the present invention, uppermost Group III nitride layers having a pit density of less than about 0.25 pits/µm$^2$ may be provided. In other embodiments, uppermost Group III nitride layers having significantly further reduced pit densities (e.g., pit densities of less than about 0.01 pits/µm$^2$ or pit densities of less than about 0.01 pits/µm$^2$) may be provided. It will be understood that herein the term "pit density" refers to the density of pits per unit area that have a diameter of about 15 nm or more (i.e., the pits that are discernible on a 2 micron by 2 micron AFM scan).

Figure 8A:
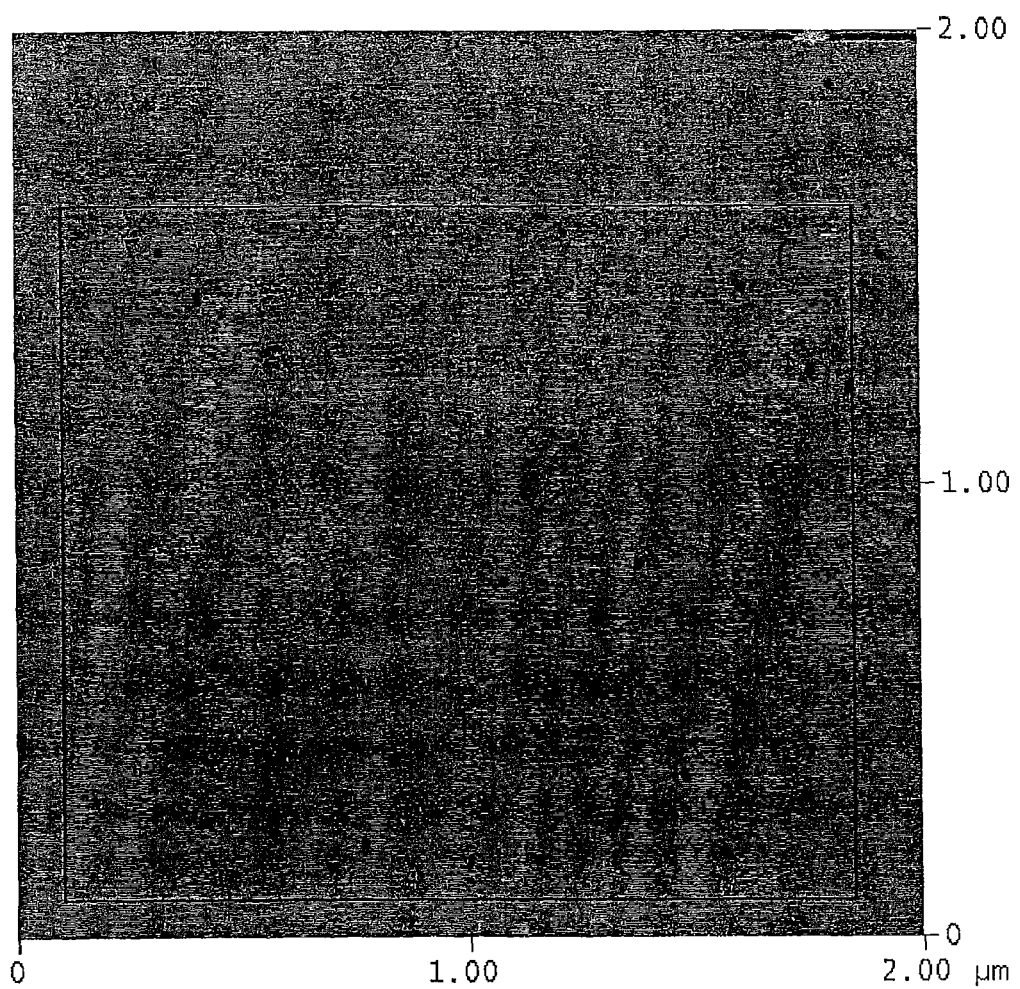
FIG. 8A is an AFM photograph of the top surface of the uppermost Group III nitride layer of an intermediate structure formed with an ex-situ silicon nitride deposition process.
Figure 8B:
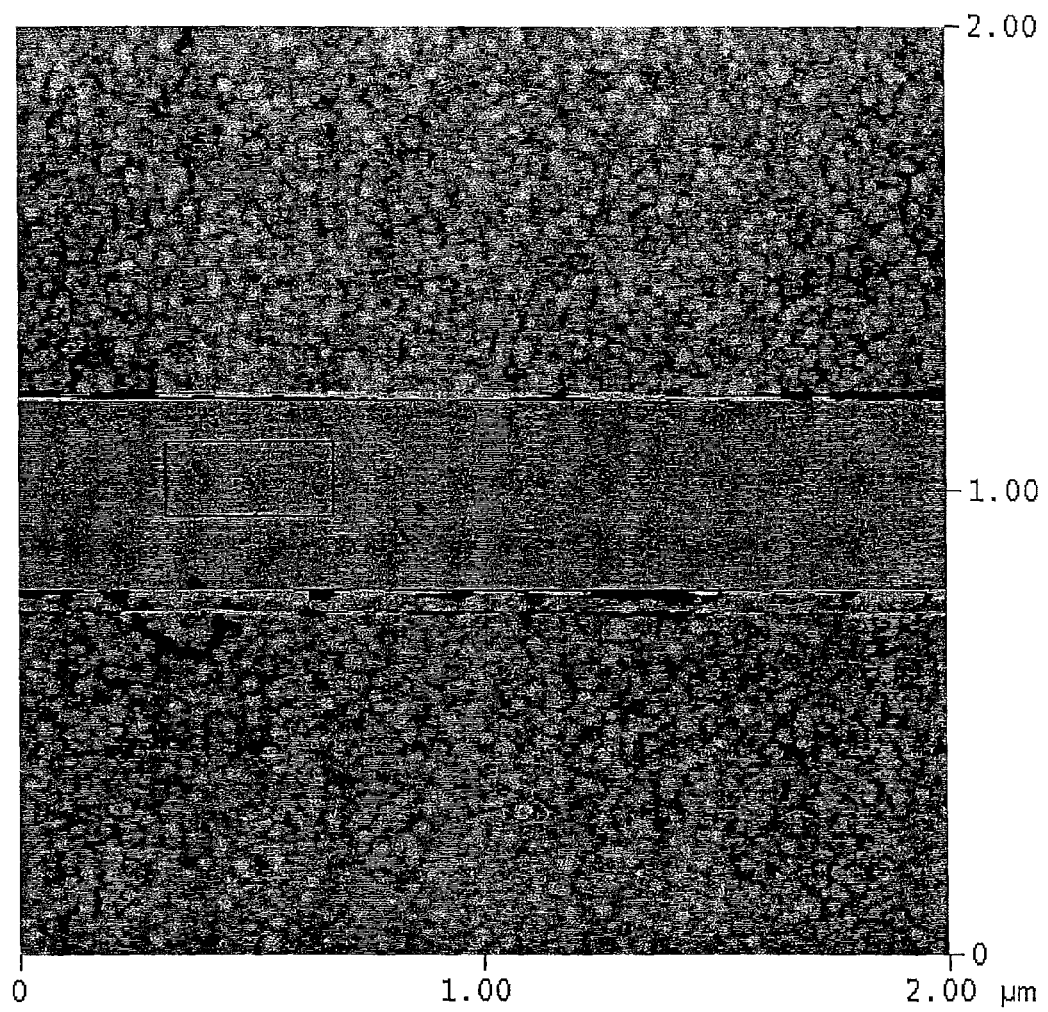
FIG. 8B is an AFM photograph illustrating the pit density on the upper surface of a Group III nitride layer of a HEMT transistor formed with an ex-situ silicon nitride deposition process.

As a comparative example, FIGS. 8A and 8B show devices that were formed that correspond to the devices of FIGS. 7A and 7B, except that the silicon nitride layer in the devices of FIGS. 8A and 8B were formed ex-situ. As shown in FIG. 8A, the top surface of the uppermost Group III nitride layer in the comparative example has a relatively high density of enlarged pits within the 2 micron by 2 micron square (i.e., about 12 enlarged pits, or a pit density of about 3 pits/µm$^2$). The device depicted in FIG. 8B has a comparable pit density. Thus, FIGS. 7A, 7B, 8A and 8B show that pursuant to embodiments of the present invention the pit density in the uppermost Group III nitride layer may be reduced.

Without intending to be bound by any theory of operation, one possible reason for the significant reduction in pit density that may be achieved in HEMT transistors according to certain embodiments of the present invention is that the inclusion of an in-situ grown SiN protective layer may act to retard formation of pits in the Group III nitride layers. In particular, such pits may form, for example, as a result of dislocations that extend through the Group III nitride layers to the surface thereof. During cooling, the dislocations at the surface may further open, resulting in pits. The larger pits shown in FIGS. 8A and 8B (e.g., 50 nm diameter) may be associated with the threading dislocations, whereas the smaller pits are usually associated with pure edge dislocations. By forming a SiN layer in-situ immediately upon completion of the growth of the Group III nitride layers (or before significant cooling of the Group III nitride layers has occurred), it may be possible to reduce and/or minimize pit formation. It will be understood that the Group III nitride layers grown according to embodiments of the present invention may still have threading and edge dislocations, but may have significantly reduced pitting from such dislocations This reduction in the pit density at, for example, the interface between an AlGaN barrier layer and a SiN protective layer may facilitate (along with other factors) reducing increases in the sheet resistance of the channel (from the sheet resistance of the channel as grown), and can also improve the reproducibility of the HEMT transistor. It is also believed that the reduction in pits can also reduce gate leakage currents in Group III nitride devices such as HEMT transistors and/or increase the reliability of the devices.

Pursuant to embodiments of the present invention, the silicon nitride protective layer may have a thickness of at least about 200 or about 250 Angstroms. In certain embodiments of the present invention, substantially thicker SiN protective layers (e.g., about 1000 Angstroms) may be provided, which may result in further enhancement to the performance and reproducibility characteristics of the device. In some embodiments of the present invention, the performance of the device improves with increasing thickness of the silicon nitride protective layer.

Pursuant to further embodiments of the present invention, sacrificial high purity SiN layers may be grown in-situ on various Group III nitride semiconductor devices such as laser diodes, LEDs, MIM photodetectors, etc. before cool down of the device from the growth temperature of the Group III nitride layers. As noted above, this technique may reduce the formation of pits on the upper surface of the uppermost Group III nitride layer. Following removal of the device from the reactor, the sacrificial SiN layer may be removed.

SiN layers fabricated according to certain embodiments of the present invention may be particularly useful in HEMT transistor applications, but may also be used in a variety of other Group III nitride devices that include protective or passivation layers and/or encapsulation. Devices in which the SiN layers according to certain embodiments of the present invention may be used include Group III nitride based laser diodes and LEDs, MIM photodetectors, MESFETs, etc. In certain embodiments of the present invention, the SiN layer may be a sacrificial layer that is grown to protect an underlying layer, but then removed in subsequent processing steps.

While embodiments of the present invention have been described primarily above with respect to silicon nitride layers, in other embodiments of the present invention the silicon nitride layer may be replaced with another insulating layer. Examples of such other insulating layers include boron nitride, alumina, silicon oxide, magnesium oxide (possibly with beryllium or calcium added as well), diamond, and silicon oxynitride. The use of such in-situ formed insulating layers on Group III nitride HEMPTS and other Group III nitride semiconductor devices may provide the above-described improvements in pit densities, sheet resistance and/or other characteristics of the devices.

In the drawings and specification, there have been disclosed typical embodiments of the invention, and, although specific terms have been employed, they have been used in a generic and descriptive sense only and not for purposes of limitation.

That which is claimed is:

1. A method of fabricating a substrate, the method comprising:
   providing a first Group III nitride layer on the substrate in a reactor;
   providing a second Group III nitride layer that is doped with an n-type dopant on the first Group III nitride layer in-situ in the reactor;
   providing an insulating layer directly on the second Group III nitride layer in-situ in the reactor;
   removing the substrate including the first Group III nitride layer, the second Group III nitride layer and the insulating layer from the reactor; and
   forming a passivation layer on the insulating layer ex situ after the substrate is removed from the reactor,
   wherein the insulating layer is a boron nitride layer.

2. A method of fabricating a substrate, the method comprising:
   providing a first Group III nitride layer on the substrate in a reactor;

providing a second Group III nitride layer that is not doped or doped with an n-type dopant on the first Group III nitride layer in-situ in the reactor;

providing an insulating layer directly on the second Group III nitride layer in-situ in the reactor; and removing the substrate including the first Group III nitride layer, the second Group III nitride layer and the insulating layer from the reactor, wherein a sheet resistance of the first Group III nitride layer following formation of the contact is less than about 1.1 times a sheet resistance of the first Group III nitride layer as grown.

3. The method of claim 2, wherein the insulating layer is formed by growing the insulating layer at a temperature above about 800° C.

4. The method of claim 2, wherein the insulating layer is non-stoichiometric in compressive or tensile strain.

5. The method of claim 2, further comprising forming ohmic contacts within openings in the insulating layer, wherein the insulating layer is formed to a thickness above the second Group III nitride layer that exceeds a thickness of the ohmic contacts above the second Group III nitride layer.

6. The method of claim 2, wherein the insulating layer is aluminum nitride, silicon dioxide and/or an oxynitride.

7. A method of fabricating a substrate, the method comprising:

providing a first Group III nitride layer on the substrate in a reactor;

providing a second Group III nitride layer that is not doped or doped with an n-type dopant on the first Group III nitride layer in-situ in the reactor;

providing an insulating layer directly on the second Group III nitride layer in-situ in the reactor; and removing the substrate including the first Group III nitride layer, the second Group III nitride layer and the insulating layer from the reactor, wherein a sheet resistance of the first Group III nitride layer following formation of the contact is less than about two times a sheet resistance of the first Group III nitride layer as grown.

8. The method of claim 7, wherein the insulating layer is formed by growing the insulating layer at a temperature above about 800° C.

9. The method of claim 7, wherein the insulating layer is non-stoichiometric in compressive or tensile strain.

10. The method of claim 7, further comprising forming ohmic contacts within openings in the insulating layer, wherein the insulating layer is formed to a thickness above the second Group III nitride layer that exceeds a thickness of the ohmic contacts above the second Group III nitride layer.

11. A method of fabricating a gallium nitride based high electron mobility transistor, the method comprising:

forming a gallium nitride based channel layer that is configured to serve as a channel for a high electron mobility transistor on a substrate in-situ in a reactor;

forming an n-type gallium nitride based barrier layer doped with silicon on the gallium nitride based channel layer using a first silicon gas source in-situ in the reactor; and then forming an insulating silicon nitride layer directly on the gallium nitride based barrier layer in-situ in the reactor using a second gas source that is different from the gas sources that are used to form the n-type gallium nitride based barrier layer.

12. The method of claim 11, wherein the insulating silicon nitride layer is formed by growing the insulating silicon nitride layer at a temperature above about 800° C.

13. The method of claim 11, wherein the insulating silicon nitride layer is non-stoichiometric in compressive or tensile strain.

14. The method of claim 11, further comprising forming ohmic contacts within openings in the insulating silicon nitride layer, wherein the insulating silicon nitride layer is formed to a thickness above the n-type gallium nitride based barrier layer that exceeds a thickness of the ohmic contacts above the n-type gallium nitride based barrier layer.

15. A method of fabricating a gallium nitride based high electron mobility transistor, the method comprising:

forming a gallium nitride based channel layer on a substrate in-situ in a reactor;

forming an n-type gallium nitride based barrier layer doped with silicon on the Group III nitride semiconductor channel layer using a first silicon gas source in-situ in the reactor; and then forming an insulating nitride layer directly on the gallium nitride based barrier layer in-situ in the reactor using a second gas source that is different from the first silicon gas source, wherein the insulating nitride layer comprises a silicon nitride layer, and wherein the second gas source comprises a second silicon gas source that has a higher silicon concentration than the first silicon gas source.

16. The method of claim 15, the method further comprising:

removing portions of the silicon nitride layer to expose the gallium nitride based barrier layer; and then forming a passivation layer directly on the remaining silicon nitride layer.

17. The method of claim 15, wherein the silicon nitride layer is directly on the gallium nitride based barrier layer, and wherein the surface of the gallium nitride based barrier layer adjoining the silicon nitride layer has a pit density of less than about 0.001 pits per $\mu m^2$.

18. The method of claim 15, wherein the insulating nitride layer is formed by growing the insulating nitride layer at a temperature above about 800° C.

19. The method of claim 15, wherein the insulating nitride layer is non-stoichiometric in compressive or tensile strain.

20. The method of claim 15, further comprising forming ohmic contacts within openings in the insulating nitride layer, wherein the insulating nitride layer is formed to a thickness above the n-type gallium nitride based barrier layer that exceeds a thickness of the ohmic contacts above the n-type gallium nitride based barrier de layer.

* * * * *